United States Patent
Yamaguchi et al.

(10) Patent No.: US 7,170,106 B2
(45) Date of Patent: Jan. 30, 2007

(54) POWER SEMICONDUCTOR DEVICE

(75) Inventors: Masakazu Yamaguchi, Kawasaki (JP);
Hideaki Ninomiya, Yokohama (JP);
Ichiro Omura, Yokohama (JP); Tomoki Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/221,702

(22) Filed: Sep. 9, 2005

(65) Prior Publication Data

US 2006/0006409 A1    Jan. 12, 2006

Related U.S. Application Data

(62) Division of application No. 10/843,571, filed on May 12, 2004, now Pat. No. 7,078,740, which is a division of application No. 10/354,048, filed on Jan. 30, 2003, now Pat. No. 6,809,349.

(30) Foreign Application Priority Data

Oct. 31, 2002    (JP) ............................. 2002-318059

(51) Int. Cl.
*H01L 29/74* (2006.01)
*H01L 29/423* (2006.01)
*H01L 31/111* (2006.01)

(52) U.S. Cl. ....................... 257/133; 257/137; 257/154; 257/165; 257/331; 257/332; 257/341; 257/342; 257/E29.183; 257/E29.212; 257/E29.213

(58) Field of Classification Search ................ 257/133, 257/137, 154, 163, 164, 165, 330, 331, 332, 257/334, 341, 342, E29.183, E29.212, E29.213
See application file for complete search history.

(56) References Cited

U.S. PATENT DOCUMENTS 4,689,871 A * 9/1987 Malhi ......................... 438/270

(Continued)

FOREIGN PATENT DOCUMENTS

JP    10-163483    6/1998

(Continued)

OTHER PUBLICATIONS

Mitsuhiko Kitagawa et al. "A 4500 V Injection Enhanced Insulated Gate Bipolar Transistor (IEGT) Operating in a Mode Similar to a Thyristor" IEDM 93-679, 1993, pp. 59-62.

(Continued)

*Primary Examiner*—Ngân V. Ngô
(74) *Attorney, Agent, or Firm*—Oblon, Spivak, McClelland, Maier & Neustadt, P.C.

(57)    ABSTRACT

A power semiconductor device includes trenches disposed in a first base layer of a first conductivity type at intervals to partition main and dummy cells, at a position remote from a collector layer of a second conductivity type. In the main cell, a second base layer of the second conductivity type, and an emitter layer of the first conductivity type are disposed. In the dummy cell, a buffer layer of the second conductivity type is disposed. A gate electrode is disposed, through a gate insulating film, in a trench adjacent to the main cell. A buffer resistor having an infinitely large resistance value is inserted between the buffer layer and emitter electrode. The dummy cell is provided with an inhibiting structure to reduce carriers of the second conductivity type to flow to and accumulate in the buffer layer from the collector layer.

10 Claims, 25 Drawing Sheets

U.S. PATENT DOCUMENTS

| | | | |
|---|---|---|---|
| 4,757,368 A | | 7/1988 | Masunaga et al. |
| 5,381,026 A | | 1/1995 | Shinohe et al. |
| 5,464,994 A | | 11/1995 | Shinohe et al. |
| 5,554,862 A | | 9/1996 | Omura et al. |
| 5,585,651 A | * | 12/1996 | Kitagawa et al. ............ 257/139 |
| 5,793,065 A | | 8/1998 | Shinohe et al. |
| 5,828,100 A | | 10/1998 | Tamba et al. |
| 6,153,896 A | | 11/2000 | Omura et al. |
| 6,236,069 B1 | * | 5/2001 | Shinohe et al. ............. 257/138 |
| 6,323,717 B1 | | 11/2001 | Omura et al. |
| 6,392,273 B1 | | 5/2002 | Chang |
| 6,566,691 B1 | | 5/2003 | Inoue et al. |

FOREIGN PATENT DOCUMENTS

| | | |
|---|---|---|
| JP | 11-330466 | 11/1999 |
| JP | 11-345969 | 12/1999 |
| JP | 2000-307116 | 2/2000 |
| JP | 2000-101076 | 4/2000 |
| JP | 2001-102579 | 4/2001 |
| JP | 2002-16252 | 1/2002 |
| JP | 2002-100770 | 4/2002 |
| JP | 2002-534811 | 10/2002 |
| JP | 2003-101020 | 4/2003 |

OTHER PUBLICATIONS

Mitsuhiko Kitagawa et al. "4.5 kV Injection Enhanced Gate Transistor: Experimental Verification of the Electrical Characteristics" Jpn. J. Appl. Phys. vol. 36, Part 1, No. 6A, 1997, pp. 3433-3437.

Ichiro Omura et al. "IEGT Design Concept Against Operation Instability and its Impact to Application" ISPSD 2000, May 22-25, 2000, pp. 25-28.

* cited by examiner

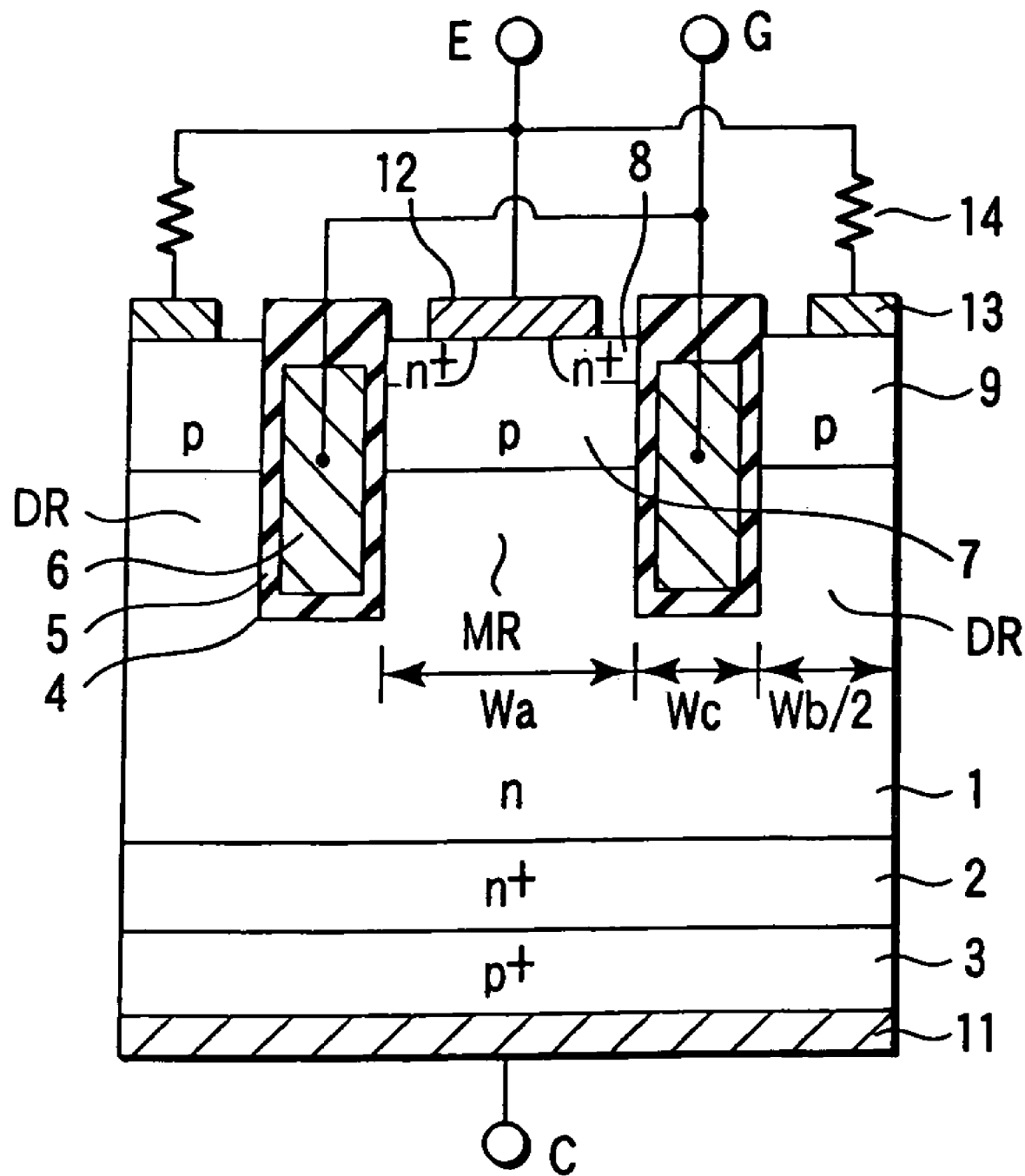
F I G. 1

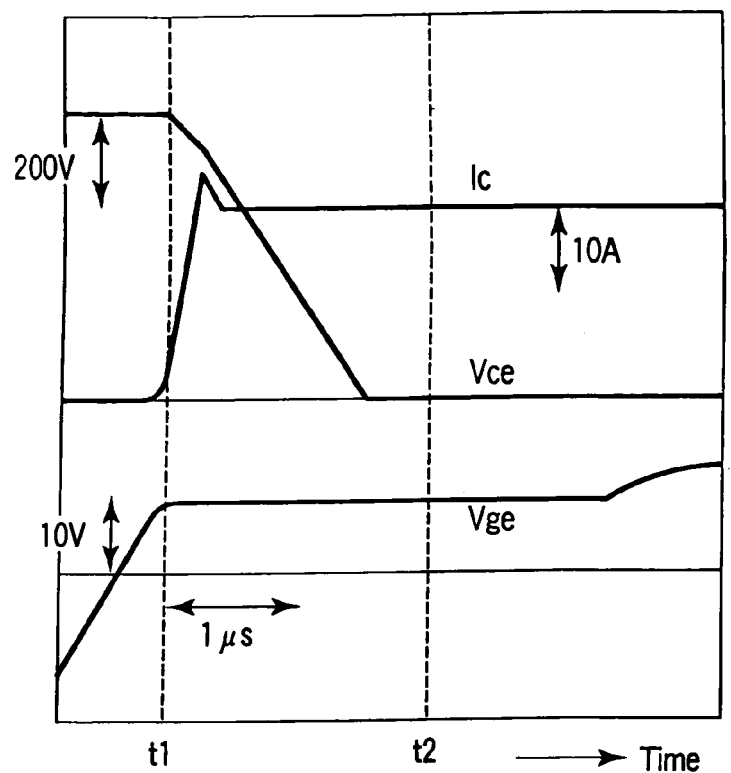
F I G. 15A
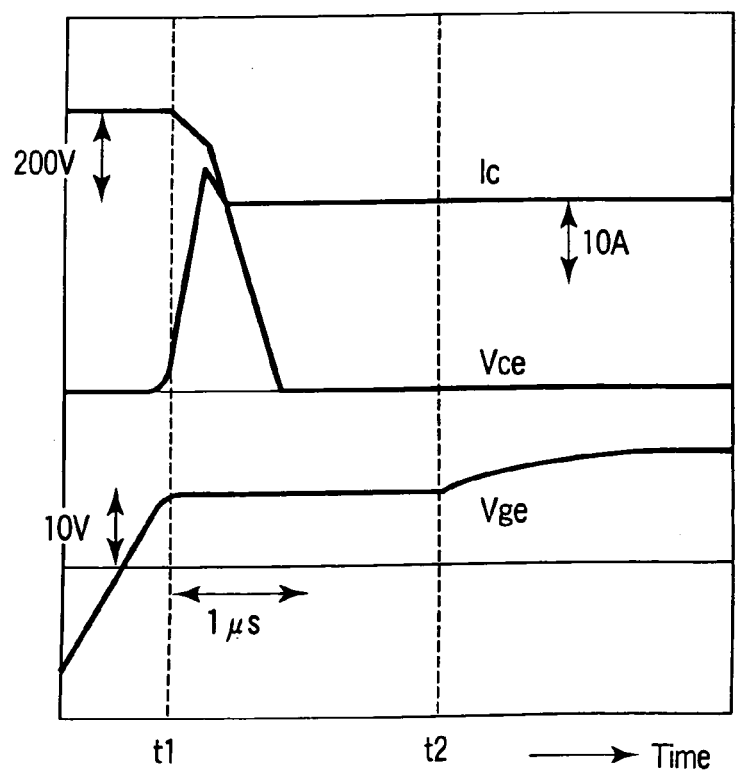
F I G. 15B

POWER SEMICONDUCTOR DEVICE

CROSS-REFERENCE TO RELATED APPLICATIONS

This application is a divisional of application Ser. No. 10/843,571 filed May 12, 2004, now U.S. Pat. No. 7,078,740, which is a divisional of application Ser. No. 10/354,048 filed Jan. 30, 2003, now U.S. Pat. No. 6,809,349, and is based upon and claims the benefit of priority from the prior Japanese Patent Application No. 2002-318059, filed Oct. 31, 2002, the entire contents of each are incorporated herein by reference.

BACKGROUND OF THE INVENTION

1. Field of the Invention

The present invention relates to a power semiconductor device, and particularly to an insulated gate semiconductor device favorably used as a power switching element.

2. Description of the Related Art

In recent years, power supply devices used in the power electronics field are strongly required to be more compact with higher performance. In accordance with this demand, power semiconductor devices have been improved to operate with lower loss and fewer noises, as well as higher breakdown voltage and larger electric current. Under the circumstances, an IEGT (Injection Enhanced Gate Transistor) obtained by improving an IGBT (Insulated Gate Bipolar Transistor) is attracting attention as a device, which can reduce the turn-off loss, as well as reducing the on-state voltage (for example, Jpn. Pat. Appln. KOKAI Publication No. 5-24356; Jpn. J. Appl. Phys. Vol. 36 (1997) pp. 3433–3437, ISSCC 2000 Digest Paper TA7.2; and M. Kitagawa et al., "A 4500V Injection Enhanced Insulated Gate Bipolar Transistor (IEGT) in a Mode Similar to a Thyristor", IEDM '93, pp. 679–682, 1993).

FIG. 25 is a sectional view showing a conventional IEGT having a trench structure. As shown in FIG. 25, on one side of an n-base layer 101, an n-buffer layer 102 is disposed, and a p-collector layer 103 is further disposed thereon. On the other side of the n-base layer 101, a plurality of trenches 104 are formed at intervals in the n-base layer 101, such that main cells MR and dummy cells DR are alternately partitioned.

In each of the main cells MR, a p-base layer 107 is disposed on the n-base layer 101. N-emitter layers 108 are formed in the surface of the p-base layer 107. In each of the dummy cells DR, a p-buffer layer 109 is disposed on the n-base layer 101. Dividing a common p-layer by the trenches 104 forms the p-base layers 107 and p-buffer layers 109.

A collector electrode 111 is disposed on the p-collector layer 103. An emitter electrode 112 is disposed on the p-base layer 107 and n-emitter layers 108. A gate electrode 106 is buried in each of the trenches 104, while it is wrapped in a gate insulating film 105. As a consequence, an n-channel MOSFET is formed in the main cell MR, such that it selectively connects the n-emitter layer 108 to the n-base layer 101, using the p-base layer 107 as a channel region, to inject electrons.

In the sectional view shown in FIG. 25, the surface of the p-buffer layer 109 in each of the dummy cells DR is covered with an insulating film 110. However, in order to fix the potential of the p-buffer layer 109, a part of the emitter electrode 112 is also disposed on the p-buffer layer 109 at a position not shown in FIG. 25. The density of the part of the emitter electrode 112 disposed on the p-buffer layer 109 is small, so that the resistance between the p-buffer layer 109 and emitter electrode 112 is equivalently large.

In this IEGT, each of the main cells MR forms a narrow current passage connecting the n-base layer 101 to the emitter electrode 112. In the on-state of the IEGT, this arrangement provides an increase in resistance against the flow of holes from the n-base layer 101 into the emitter electrode 112 through the p-base layer 107 in the main cell MR, thereby restricting the holes being exhausted into the emitter electrode 112. As a consequence, the injection efficiency of electrons from the n-emitter layers 108 into the n-base layer 101 improves, thereby promoting conductivity modulation of the n-base layer 101, resulting in a low on-state voltage.

A CSTBT (Carrier Stored Trench-Gate Bipolar Transistor) has also been proposed as a power semiconductor device, which can reduce the on-resistance as in the IEGT (for example, H. Takahashi et al., "Carrier Stored Trench-Gate Bipolar Transistor (CSTBT)—A Novel Power Device for High Voltage Application" ISPSD '96, pp. 349–352, 1996). FIG. 26 is a sectional view showing a conventional CSTBT.

As shown in FIG. 26, on one side of an n-base layer 131, a p-collector layer 133 is disposed. On the other side of the n-base layer 131, an n-barrier layer 132 having an impurity concentration higher than that of the n-base layer 131 is disposed. A p-base layer 137 is disposed on the n-barrier layer 132. N-emitter layers 138 are formed in the surface of the p-base layer 137. A plurality of trenches 134 are formed at intervals such that they extend from the substrate surface into the n-base layer 131.

A collector electrode 141 is disposed on the p-collector layer 133. An emitter electrode 142 is disposed on the p-base layer 137 and n-emitter layers 138. A gate electrode 136 is buried in each of the trenches 134, while it is wrapped in a gate insulating film 135. As a consequence, an n-channel MOSFET is formed such that it selectively connects the n-emitter layer 138 to the n-base layer 131, using the p-base layer 137 as a channel region, to inject electrons.

In this CSTBT, the n-barrier layer 132 having a high impurity concentration provides a large resistance against flow of holes. In the on-state of the CSTBT, this arrangement provides an increase in resistance against the flow of holes from the n-base layer 131 into the emitter electrode 142 through the p-base layer 137, thereby restricting the holes being exhausted into the emitter electrode 142. As a consequence, the injection efficiency of electrons from the n-emitter layers 138 into the n-base layer 131 improves, thereby promoting conductivity modulation of the n-base layer 131, resulting in a low on-state voltage.

The conventional IEGT and CSTB, used as power semiconductor devices, have the advantage of providing a low on-state voltage. However, these conventional power semiconductor devices have a problem causing a large noise in switching, and especially being turned on, as described above. In addition, since the resistance against holes being exhausted is high, a problem arises in that a period of time (storage period) for a depletion layer to extend up from the start of voltage rising is prolonged when the devices are turned off. This increases the turn-off loss, as well as the turn-off time.

BRIEF SUMMARY OF THE INVENTION

According to a first aspect of the present invention, there is provided a power semiconductor device comprising:

a first base layer of a first conductivity type;

a collector layer of a second conductivity type disposed on the first base layer;

a plurality of trenches disposed in the first base layer at intervals to partition a main cell and a dummy cell, at a position remote from the collector layer;

a second base layer of the second conductivity type disposed on the first base layer in the main cell;

an emitter layer of the first conductivity type disposed on the second base layer;

a buffer layer of the second conductivity type disposed on the first base layer in the dummy cell;

a gate electrode disposed in a trench of the plurality of trenches, adjacent to the main cell, to face, through a gate insulating film, a portion of the second base layer sandwiched between the first base layer and the emitter layer;

a collector electrode disposed on the collector layer;

an emitter electrode disposed on the second base layer and the emitter layer; and a buffer resistor inserted between the buffer layer and the emitter electrode, wherein the main cell forms a current passage narrow enough to provide, in an on-state of the device, an increase in resistance against flow of carriers of the second conductivity type from the first base layer into the emitter electrode through the second base layer, thereby improving injection efficiency of carriers of the first conductivity type from the emitter layer into the first base layer, and the buffer resistor has a resistance value smaller than that with which gate-emitter voltage is increased by gate negative capacity, in a period of time for an applied voltage between gate and emitter to charge capacity between gate and collector, in process of turn-on of the device.

According to a second aspect of the present invention, there is provided a power semiconductor device comprising:

a first base layer of a first conductivity type;

a collector layer of a second conductivity type disposed on the first base layer;

a plurality of trenches disposed in the first base layer at intervals to partition a main cell and a dummy cell, at a position remote from the collector layer;

a second base layer of the second conductivity type disposed on the first base layer in the main cell;

an emitter layer of the first conductivity type disposed on the second base layer;

a buffer layer of the second conductivity type disposed on the first base layer in the dummy cell;

a gate electrode disposed in a trench of the plurality of trenches, adjacent to the main cell, to face, through a gate insulating film, a portion of the second base layer sandwiched between the first base layer and the emitter layer;

a collector electrode disposed on the collector layer;

an emitter electrode disposed on the second base layer and the emitter layer; and a buffer resistor inserted between the buffer layer and the emitter electrode and having an infinitely large resistance value, wherein the main cell forms a current passage narrow enough to provide, in an on-state of the device, an increase in resistance against flow of carriers of the second conductivity type from the first base layer into the emitter electrode through the second base layer, thereby improving injection efficiency of carriers of the first conductivity type from the emitter layer into the first base layer, and the dummy cell is provided with an inhibiting structure configured to reduce a quantity of carriers of the second conductivity type to flow to and accumulate in the buffer layer from the collector layer, in a period of time for an applied voltage between gate and emitter to charge capacity between gate and emitter, in process of turn-on of the device, as compared to a case where the buffer layer and the second base layer are formed with the same impurity concentration and depth.

According to a third aspect of the present invention, there is provided a power semiconductor device comprising:

a first base layer of a first conductivity type;

a collector layer of a second conductivity type disposed on the first base layer;

a plurality of trenches disposed in the first base layer at intervals to partition a main cell and a dummy cell, at a position remote from the collector layer;

a second base layer of the second conductivity type disposed on the first base layer in the main cell;

an emitter layer of the first conductivity type disposed on the second base layer;

a buffer layer of the second conductivity type disposed on the first base layer in the dummy cell;

a gate electrode disposed in a trench of the plurality of trenches, adjacent to the main cell, to face, through a gate insulating film, a portion of the second base layer sandwiched between the first base layer and the emitter layer;

a collector electrode disposed on the collector layer;

an emitter electrode disposed on the second base layer and the emitter layer; and a buffer resistor inserted between the buffer layer and the emitter electrode and having an infinitely large resistance value, wherein the main cell forms a current passage narrow enough to provide, in an on-state of the device, an increase in resistance against flow of carriers of the second conductivity type from the first base layer into the emitter electrode through the second base layer, thereby improving injection efficiency of carriers of the first conductivity type from the emitter layer into the first base layer, and a switching element configured to selectively connect the buffer layer to the second base layer is formed at a position beyond an end of the gate electrode in a channel width direction, and carriers of the second conductivity type are exhausted from the buffer layer to the second base layer through the switching element, in a period of time for an applied voltage between gate and emitter to charge capacity between gate and emitter, in process of turn-on of the device.

According to a fourth aspect of the present invention, there is provided a power semiconductor device comprising:

a first base layer of a first conductivity type;

a collector layer of a second conductivity type disposed on the first base layer;

a trench disposed in the first base layer at a position remote from the collector layer;

a second base layer of the second conductivity type disposed on the first base layer and in contact with the trench;

an emitter layer of the first conductivity type disposed on the second base layer;

a gate electrode disposed in the trench to face, through a gate insulating film, a portion of the second base layer sandwiched between the first base layer and the emitter layer;

a collector electrode disposed on the collector layer;

an emitter electrode disposed on the second base layer and the emitter layer;

a barrier layer of the first conductivity type disposed between the first base layer and the second base layer, and having an impurity concentration higher than that of the first base layer, the barrier layer providing, in an on-state of the device, an increase in resistance against flow of carriers of the second conductivity type from the first base layer into the emitter electrode through the second base layer, thereby improving injection efficiency of carriers of the first conductivity type from the emitter layer into the first base layer;

a diverter layer of the second conductivity type disposed on the first base layer, to exhaust carriers of the second conductivity type from the first base layer; and a rectifying element including a portion of the first conductivity type electrically connected to the emitter electrode, and a portion of the second conductivity type electrically connected to the diverter layer, the rectifying element becoming conductive by a change in potential of the diverter layer, thereby exhausting carriers of the second conductivity type from the diverter layer into the emitter electrode, in process of turn-off of the device.

According to a fifth aspect of the present invention, there is provided a power semiconductor device comprising:

a first base layer of a first conductivity type;

a collector layer of a second conductivity type disposed on the first base layer;

a trench disposed in the first base layer at a position remote from the collector layer;

a second base layer of the second conductivity type disposed on the first base layer and in contact with the trench;

an emitter layer of the first conductivity type disposed on the second base layer;

a gate electrode disposed in the trench to face, through a gate insulating film, a portion of the second base layer sandwiched between the first base layer and the emitter layer;

a collector electrode disposed on the collector layer;

an emitter electrode disposed on the second base layer and the emitter layer;

a barrier layer of the first conductivity type disposed between the first base layer and the second base layer, and having an impurity concentration higher than that of the first base layer, the barrier layer providing, in an on-state of the device, an increase in resistance against flow of carriers of the second conductivity type from the first base layer into the emitter electrode through the second base layer, thereby improving injection efficiency of carriers of the first conductivity type from the emitter layer into the first base layer;

a diverter layer of the second conductivity type disposed on the first base layer, to exhaust carriers of the second conductivity type from the first base layer; and an MOSFET with a second conductivity type channel configured to be driven by a driving electrode electrically connected to the gate electrode to selectively connect the diverter layer to the emitter electrode, the MOSFET with a second conductivity type channel becoming conductive by a change in potential of the driving electrode, thereby exhausting carriers of the second conductivity type from the diverter layer into the emitter electrode, in process of turn-off of the device.

BRIEF DESCRIPTION OF THE SEVERAL VIEWS OF THE DRAWING

FIG. 1 is a sectional view showing a power semiconductor device (IEGT) according to a first embodiment of the present invention;

FIGS. 15A and 15B are graphs obtained by experiments and showing voltage and current waveforms in the turn-on of an IEGT according to a comparative example 2, and an IEGT according to a present example 2 of the seventh embodiment, respectively;

DETAILED DESCRIPTION OF THE INVENTION

Figure 25:
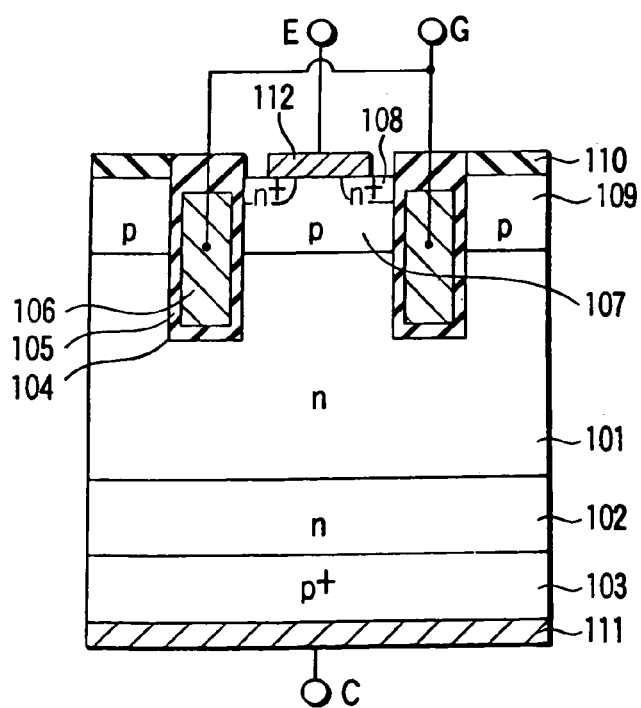
FIG. 25 is a sectional view showing a conventional IEGT having a trench structure.
Figure 26:
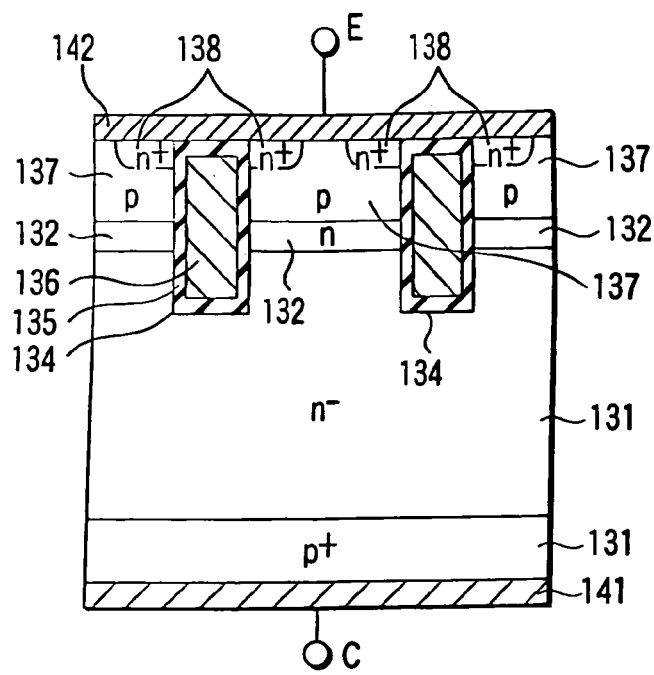
FIG. 26 is a sectional view showing a conventional CSTBT.

In the process of developing the present invention, the inventors conducted research on the conventional IEGT shown in FIG. 25 and so forth. As a result, the inventors have arrived at the findings given below.

In the IEGT shown in FIG. 25, the density of the part of the emitter electrode 112 disposed on the p-buffer layers 109 is set small enough to prevent holes from leaking into the emitter electrode 112. In other words, the resistance between the p-buffer layers 109 and emitter electrode 112 is very large. As a consequence, the IEGT has the advantage of obtaining a low on-state voltage, while it has the following problem.

Specifically, in switching of the IEGT, and especially in the turn-on, the voltage change rate (dV/dt) between the collector and emitter is large, thereby generating an excessive switching noise. In general, the dV/dt of an insulated gate semiconductor device, such as a MOSFET or IGBT, can be reduced to suppress the switching noise by adjusting charge/discharge time of the gate capacitance by means of a gate resistor. In the IEGT shown in FIG. 25, however, the dV/dt cannot be controlled by a gate resistor, but maintains a high value.

These problems seem to be caused on the basis of the relationship between the applied voltage between the gate and emitter (in other words, the voltage applied to the gate electrode) and holes accumulating in that surface region of each dummy cell, which is not deeper than the trench, and especially in the p-buffer layer 109, in the process of turn-on of the IEGT. Specifically, in the process of turn-on of the IEGT, with an increase in the applied voltage between the gate and emitter, the IEGT passes through the following two periods of time until it comes into an on-state. In the first period of time, the applied voltage between the gate and emitter is used to charge the capacity between the gate and emitter. In the second period of time (Miller period), the applied voltage between the gate and emitter charges the capacity between the gate and collector.

In the first period of time, the gate-emitter voltage (the electric potential difference between the gate and emitter) increases from an initial negative voltage toward a predetermined positive voltage. In this period of time, mainly, an inversion layer is formed in that surface portion of the p-base layer 107 and p-buffer layer 109, which faces each gate electrode 106, and electrons accumulate and start being injected. In the next Miller period, ideally, the gate-emitter voltage maintains the positive predetermined voltage (however, it deviates from the ideal state, thereby generating noises). In this period of time, mainly, positive spatial charge is removed in that portion of the n-base layer 101, which faces each gate electrode 106.

The conventional IEGT has a very large resistance between the p-buffer layers 109 and emitter electrode 112. This increases the quality of holes to accumulate in the surface portion of each dummy cell adjacent to the corresponding trench 104 (a portion of the p-buffer layer 109 and n-base layer 101 sandwiched between two trenches 14), in the first period of time in the process of turn-on of the IEGT, and especially in a period of time just after electrons start being injected. The holes accumulating in the p-buffer layers 109 causes an excessive switching noise when the IEGT is turned on. The principle of such a phenomenon will be explained in more detail, in relation to embodiments described later.

On the other hand, in relation to the turn-off characteristic of power semiconductor devices, a diverter structure has been proposed as a structure for reducing the turn-off loss of an IGBT (for example, R. Constapel, J. Korec and B. J. Baliga, "Trench-IGBTs with Integrated Diverter Structures", ISPSD '95, pp. 201–206, 1995). This structure includes a p-diverter layer formed in the n-base layer of an IGBT, so that holes in the n-base layer are exhausted therethrough when the IGBT is turned off. This structure has problems in that accumulating carriers are reduced in the on-state thereby increasing the on-resistance, and its manufacture is structurally difficult.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary. In the following embodiments, the first conductivity type is n-type, and the second conductivity type is p-type.

(First Embodiment)

FIG. 1 is a sectional view showing a power semiconductor device (IEGT) according to a first embodiment of the present invention. As shown in FIG. 1, on one side of an n-base layer 1 having a high resistivity, an n-buffer layer 2 having a high impurity concentration is disposed, and a p-collector layer 3 having a high impurity concentration is further disposed thereon. The n-buffer layer 2 may be omitted such that the p-collector layer 3 is in direct contact with the n-base layer 1. On the other side of the n-base layer 1, a plurality of trenches 4 are formed at intervals in the n-base layer 1, such that main cells MR and dummy cells DR are partitioned.

In each of the main cells MR, a p-base layer 7 is disposed on the n-base layer 1. N-emitter layers 8 are formed in the surface of the p-base layer 7. In each of the dummy cells DR, a p-buffer layer 9 is disposed on the n-base layer 1. The p-base layers 7 and p-buffer layers 9 may be formed independently of each other, or may be formed by dividing a common p-layer by the trenches 4.

A collector electrode 11 is disposed on and in contact with the p-collector layer 3. An emitter electrode 12 is disposed on and in contact with the p-base layer 7 and n-emitter layers 8. A p-contact layer having a high impurity concentration may be formed in the p-base layer 7 and in contact with the emitter electrode 12.

Of the trenches 4, the trench 4 adjacent to each of the main cells MR is provided with a gate electrode 6 buried therein, while it is wrapped in a gate insulating film 5. Where the main cells MR and dummy cells DR are alternately disposed, the gate electrode 6 is buried in each of all the trenches 4. The gate electrode 6 faces that portion of the p-base layer 7, which is sandwiched between the n-base layer 1 and n-emitter layer 8, through the gate insulating film 5.

As a consequence, an n-channel MOSFET is formed in the main cell MR, such that it selectively connects the n-emitter layer 8 to the n-base layer 1, using the p-base layer 7 as a channel region, to inject electrons. On the other hand, the dummy cells DR are not provided with such an n-channel MOSFET.

The IEGT shown in FIG. 1 can attain a low on-state voltage almost the same as that of a thyrister, where the depth, width, interval of the trenches 4 are suitably designed. This is given by the dummy cells DR that bring about resistance against hole current injected from the p-collector layer 3, as follows. Specifically, the dummy cells DR provide a lateral resistance of the n-base layer 1, and each of the main cells MR forms a current passage connecting the n-base layer 1 to the emitter electrode 12, which is narrow enough to generate a resistance.

In the on-state of the IEGT, this arrangement provides an increase in resistance against the flow of holes from the p-collector layer 3 into the emitter electrode 12 through the n-base layer 1 and p-base layer 7 in the main cell MR, thereby restricting the holes being exhausted into the emitter electrode 12. As a consequence, the injection efficiency of electrons from the n-emitter layers 8 into the n-base layer 1 improves, thereby promoting conductivity modulation of the n-base layer 1, resulting in a low on-state voltage.

A buffer electrode 13 is disposed on the p-buffer layer 9 in each of the dummy cells DR. The buffer electrode 13 is electrically connected to the emitter electrode 12 through a buffer resistor 14. In this embodiment, the buffer resistor 14 employs the resistance of an interconnection line including a resistor, which is placed outside the p-buffer layer 9 and electrically connects the buffer electrode 13 to the emitter electrode 12.

Figure 2A:
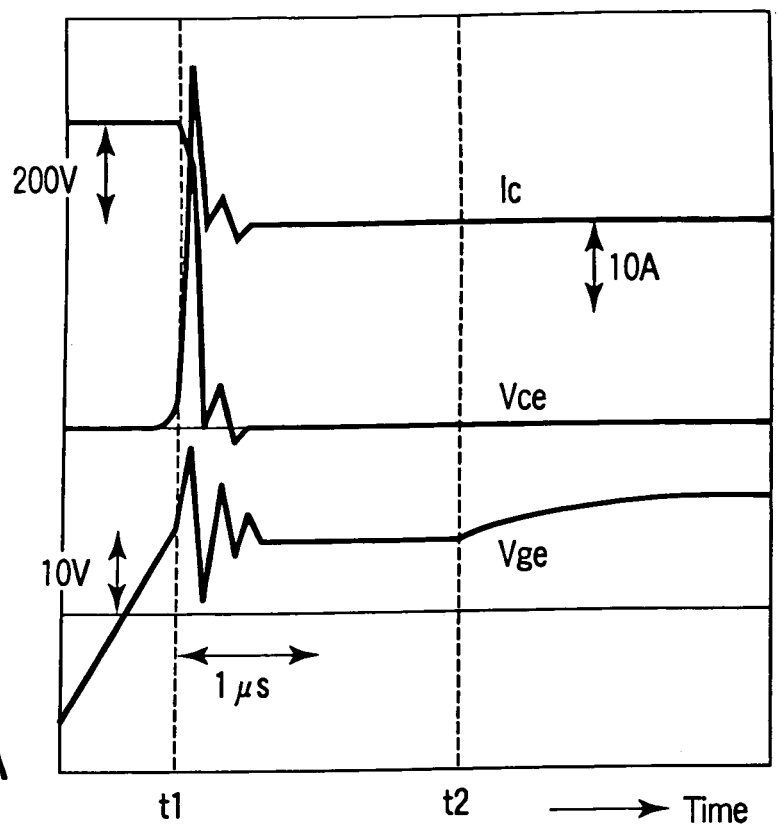
FIGS. 2A and 2B are graphs obtained by experiments and showing voltage and current waveforms in the turn-on of an IEGT according to a comparative example 1, and an IEGT according to a present example 1 of the first embodiment, respectively.
Figure 2B:
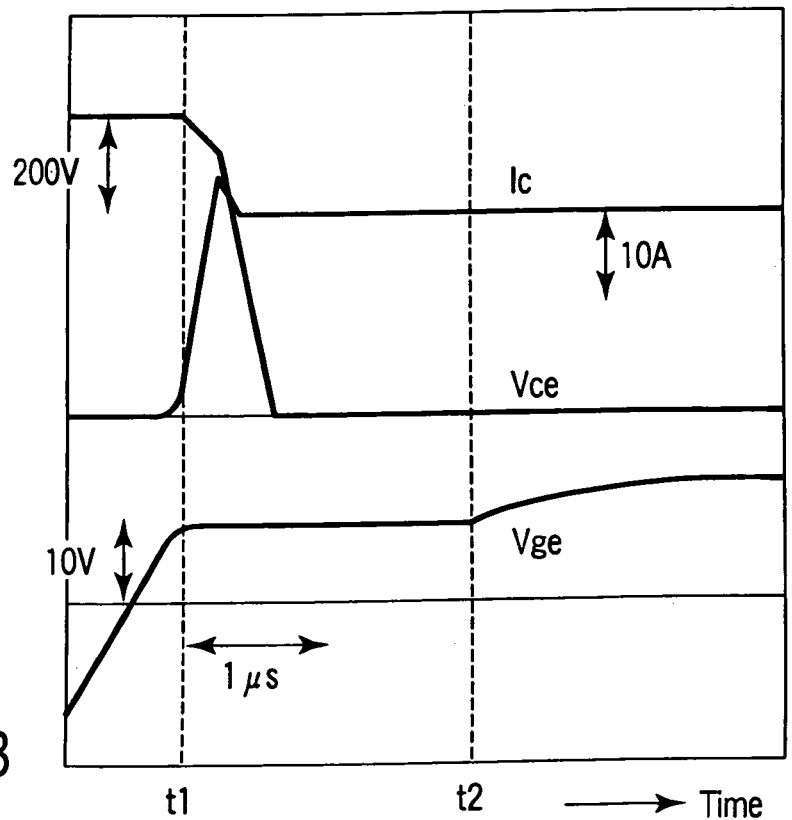

FIGS. 2A and 2B are graphs obtained by experiments and showing voltage and current waveforms in the turn-on of an IEGT according to a comparative example 1, and an IEGT according to a present example 1 of the first embodiment, respectively. In FIGS. 2A and 2B, Vge stands for the gate-emitter voltage, Vce for the collector-emitter voltage, and Ic for the collector current.

In the experiments, both the IEGTs according to the comparative example 1 and present example 1 were provided with a breakdown voltage of 1,200V, an applied voltage of 600V between the collector and emitter, and a gate resistance Rg of 51 Ω. The IEGT according to the comparative example 1 was provided with a resistance of 10 Ω between the p-buffer layer 109 and emitter electrode 112, while the IEGT according to the present example 1 was provide with a resistance of 1 Ω between the p-buffer layer 9 and emitter electrode 12.

As shown in FIG. 2A, in the IEGT according to the comparative example 1, the voltage change rate (dV/dt) between the collector and emitter was about 20 kV/μs or more, thereby fiercely shaking the waveforms, at the early stage of the Miller period t1 to t2 (a period of time for the applied voltage between the gate and emitter to charge the capacity between the gate and collector). On the other hand, as shown in FIG. 2B, in the IEGT according to the present example 1, the dV/dt was reduced to about 5 kV/μs or less, thereby suppressing shaking of the waveforms, at the early stage of the Miller period t1 to t2.

Furthermore, both the IEGTs according to the comparative example 1 and present example 1 were subjected to experiments in changing the gate resistance Rg. As a consequence, the IEGT according to the comparative example 1 barely showed a change in the dV/dt with the change in the gate resistance Rg. On the other hand, the IEGT according to the present example 1 allowed the dV/dt to be adjusted to, e.g., 2 to 10 kV/μs with the change in the gate resistance Rg.

Figure 3A:
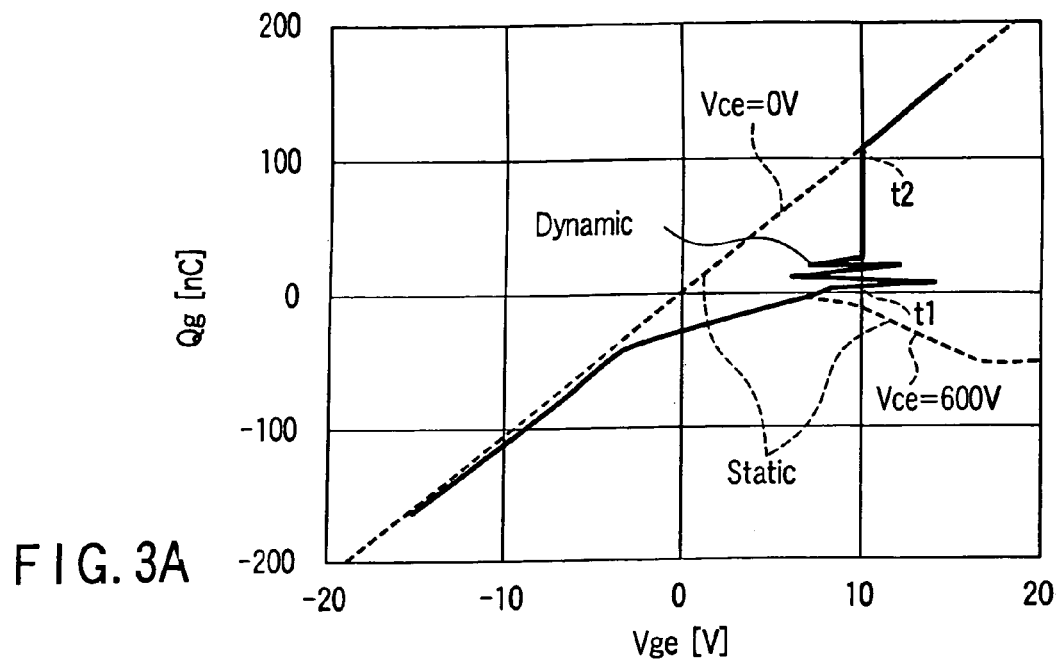
FIGS. 3A and 3B are graphs obtained by simulations and showing gate charge characteristics in the turn-on of the IEGT according to the comparative example 1, and the IEGT according to the present example 1, respectively.
Figure 3B:
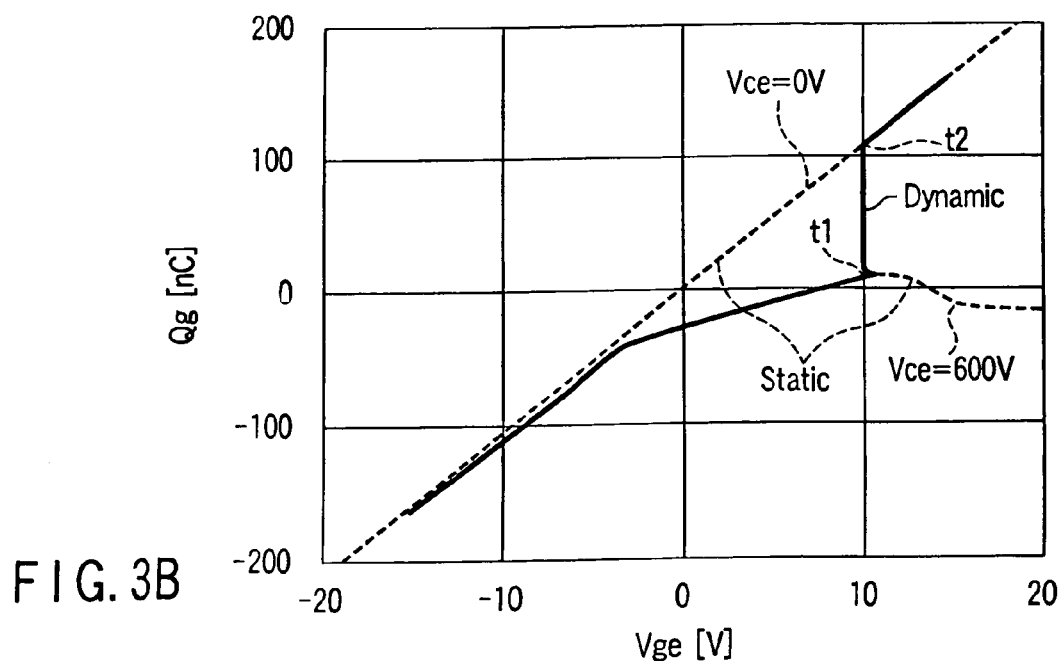

FIGS. 3A and 3B are graphs obtained by simulations and showing gate charge characteristics in the turn-on of the IEGT according to the comparative example 1, and the IEGT according to the present example 1, respectively. In FIGS. 3A and 3B, Vge stands for the gate-emitter voltage, Vce for the collector-emitter voltage, and Qg for the gate charge. Furthermore, solid lines show characteristics obtained by dynamic calculation, while broken lines show characteristics obtained by static calculation (Vce=0V and Vce=600V). The conditions on the IEGTs in the simulations were the same as those explained with reference to FIGS. 2A and 2B, except for parameters of the simulations.

In the IEGT according to the comparative example 1, the gate-emitter voltage Vge of the Miller period (a period of time t1 to t2 in FIG. 2A), which will be referred to as Vge(on), is present in a Vge range where the Qg decreases with an increase in the Vge on the static characteristic of Vce=600V (Vge range showing negative capacity). In this case, the Qg waveform of the dynamic characteristic fiercely shakes. On the other hand, in the IEGT according to the present example 1, the Vge range showing the negative capacity shifts to the high voltage side, where the Vge(on) is not present. In this case, the Qg waveform of the dynamic characteristic barely shakes.

The phenomenon of the Qg decreasing with an increase in the Vge is called negative capacity (gate negative capacity), because Cg=dQg/dVge becomes negative. The negative capacity is known as a cause of bringing about a current unbalance in parallel driving of semiconductor devices (for example, Jpn. Pat. Appln. KOKAI Publication No. 2000-40951, and IEEE ELECTRON DEVICE LETTERS, VOL. 18, pp. 121–123). In addition, according to study by the present inventors, the following matters have been found in the relationship between the negative capacity and switching noise of IEGTs.

Specifically, where the Vge(on) of the Miller period is present in a Vge range showing the negative capacity, the Vge shakes as appearing in the dynamic characteristic of the IEGT according to the comparative example 1. Since the Vge shakes and rises for a short time, the collector current is caused to abruptly flow, thereby generating a large dV/dt.

The negative capacity of the IEGT results from an increase in the potential of the p-buffer layer caused by holes accumulating in that region of the p-buffer layer and n-base layer in the dummy cell DR, which is shallower than the trenches (i.e., an inter-trench region of the dummy cell). The increase in the potential of the p-buffer layer can be controlled by the resistance value of a resistor electrically connecting the p-buffer layer to the emitter electrode.

Where a predetermined buffer resistor 14 is arranged to electrically connect the p-buffer layer 9 to the emitter electrode 12, a Vge range in which the negative capacity appears can be adjusted, as in the IEGT according to this embodiment. In other words, a predetermined buffer resistor 14 is used such that the Vge(on) is not present in a Vge range showing the negative capacity, so as to prevent the Vge from shaking and to prevent a high dV/dt from occurring thereby.

Figure 4A:
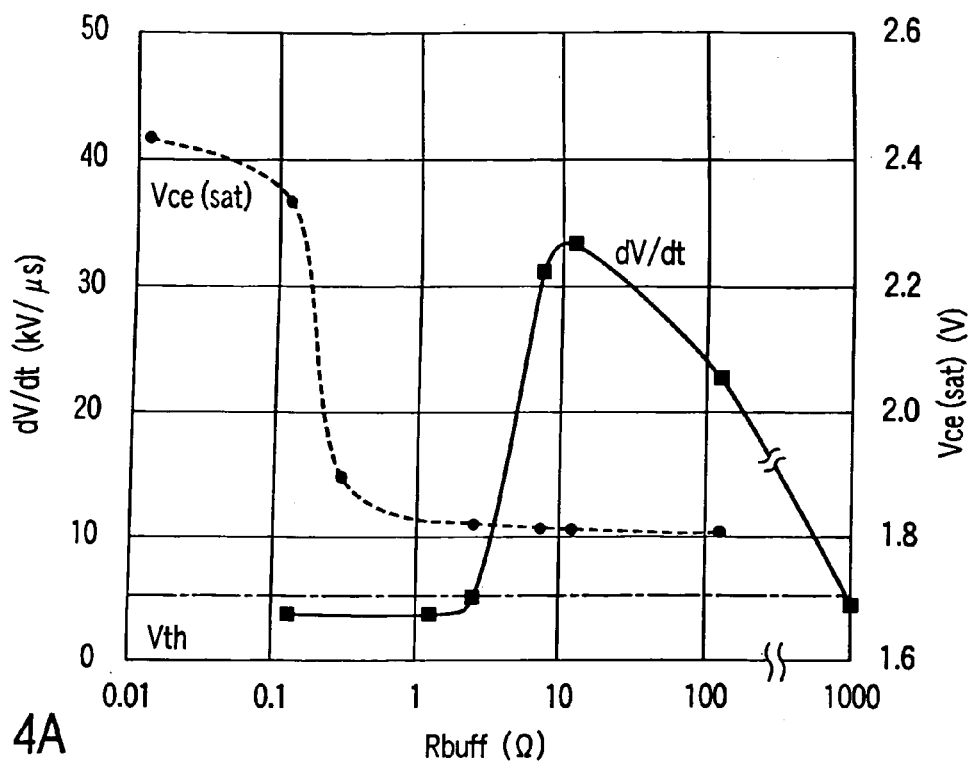
FIGS. 4A and 4B are graphs obtained by simulations and showing the relationship of the dV/dt and on-state voltage relative to the resistance value Rbuff of a buffer resistor, and the relationship of the Vge range NCR, in which the Vge-Qg characteristic shows negative capacity, and on-state voltage relative to the Rbuff, respectively.
Figure 4B:
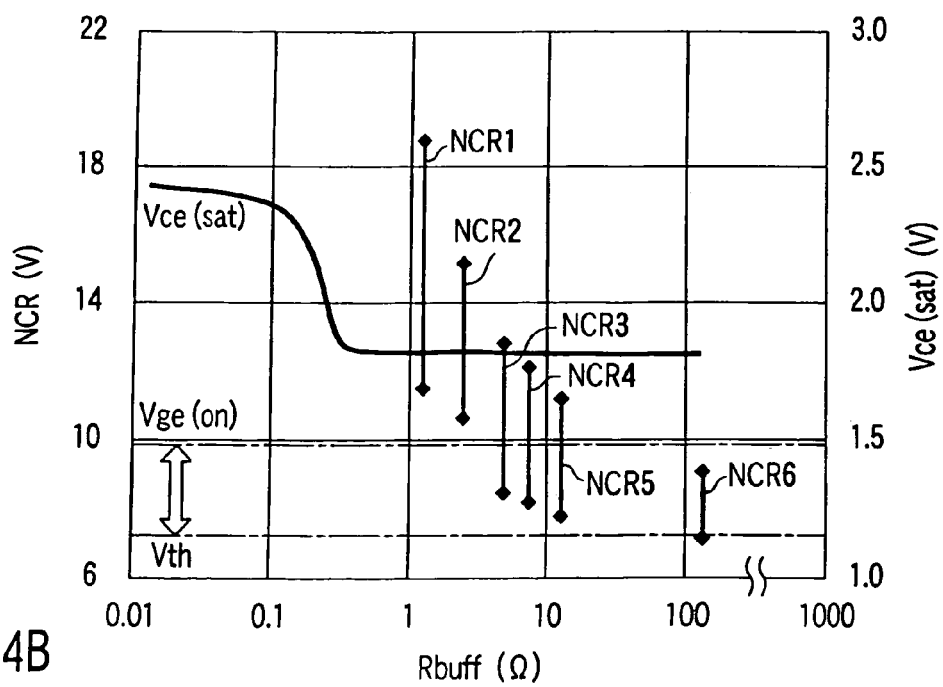

FIGS. 4A and 4B are graphs obtained by simulations and showing the relationship of the dV/dt and on-state voltage relative to the resistance value Rbuff of a buffer resistor 14, and the relationship of the Vge range NCR, in which the Vge-Qg characteristic shows negative capacity, and on-state voltage relative to the Rbuff, respectively. In FIGS. 4A and 4B, Vce(sat) stands for the collector-emitter voltage in the on-state (saturation voltage), Vge(on) for the gate-emitter voltage when not shaking in the Miller period, and Vth for the gate threshold voltage. The conditions on the IEGTs in the simulations were the same as those explained with reference to FIGS. 2A and 2B, except for parameters of the simulations.

The IEGT according to this embodiment is conceived to attain a characteristic for reducing the switching noise while maintaining a low on-state voltage characteristic. Accordingly, in FIG. 4A, a range where the Vce(sat) is low and the dV/dt is small corresponds to a preferable range of the resistance value Rbuff of the buffer resistor 14. Under the conditions of the simulations, the preferable range of the Rbuff is about 0.3 to 3 Ω.

As shown in FIG. 4B, with an increase in the resistance value Rbuff of the buffer resistor 14, the value of the Vge ranges NCR1 to NCR6 showing the negative capacity becomes lower. In the NCR1 and NCR2 where the Rbuff is 3 Ω or less, these ranges appear above the Vge(on). In these cases, since the device reaches the on-state before suffering the influence of the negative capacity, switching noises are prevented from occurring.

Oh the other hand, in the NCR3 to NCR6 where the Rbuff is 5 Ω or more, these ranges appear across or below the Vge(on). This means that the Vge(on) of the Miller period is present in a Vge range showing the negative capacity. In this case, as in conventional IEGTs accompanied by switching noises, since the Vge shakes and rises for a short time, the collector current is caused to abruptly flow, thereby generating a large dV/dt.

As described above, the IEGT according to this embodiment can reduce switching noises while maintaining a low on-state voltage characteristic. In the turn-on of the IEGT, the voltage change rate (dV/dt) between the collector and emitter is gentle, and the dV/dt is adjustable by the gate resistance. The IEGT according to this embodiment may allow the on-state voltage to be further reduced, by reducing the width Wa of each main cell MR, expanding the width Wb of each dummy cell DR, or expanding the width Wc of each trench 4.

(Second Embodiment)

Figure 5:
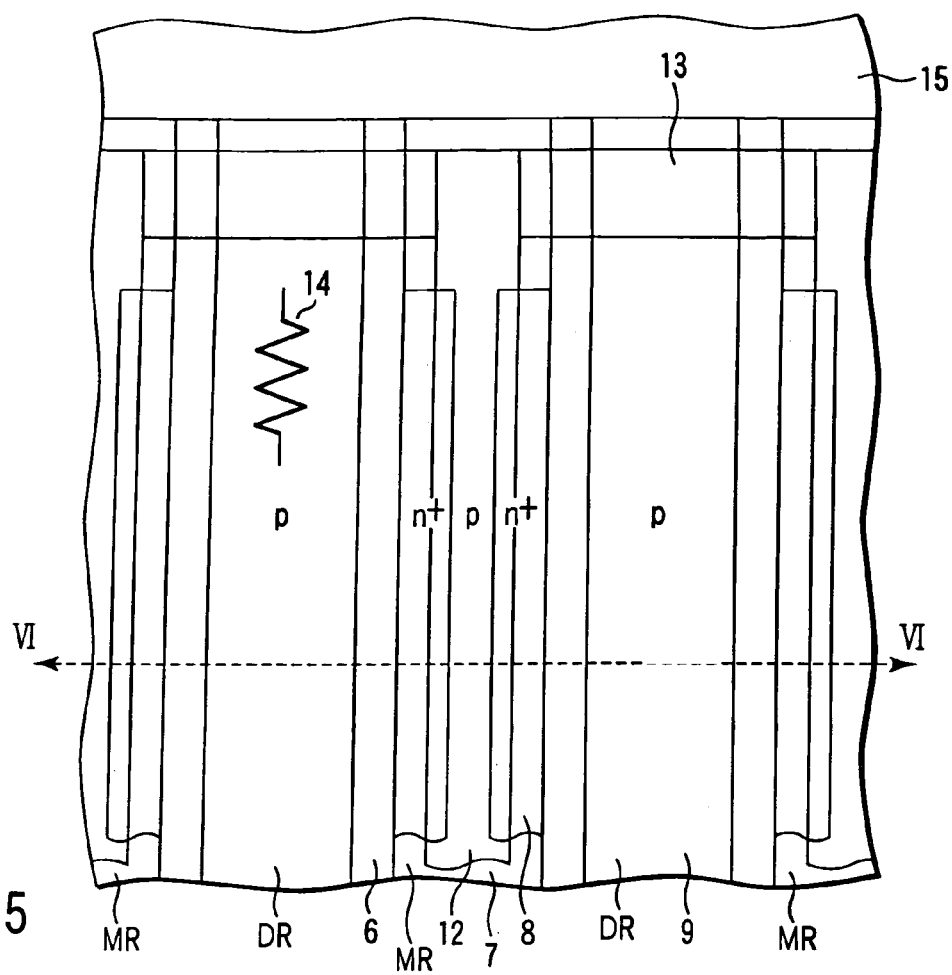
FIG. 5 is a view showing the plan layout of a power semiconductor device (IEGT) according to a second embodiment of the present invention.
Figure 6:
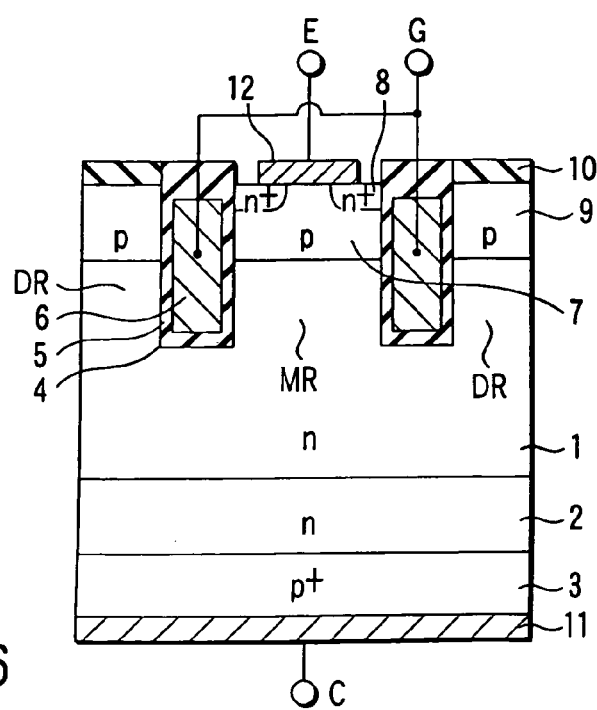
FIG. 6 is a sectional view taken along line VI—VI in each of FIGS. 5, 7, 8, 10, 12, 20, and 22.

FIG. 5 is a view showing the plan layout of a power semiconductor device (IEGT) according to a second embodiment of the present invention. FIG. 6 is a sectional view taken along line VI—VI in FIG. 5. This embodiment adopts a buffer resistor 14 mainly employing a lateral resistance of a p-buffer layer 9. In other words, the buffer resistor 14 is planarly structured.

Specifically, the surface of the p-buffer layer 9 in each of dummy cells DR is covered with an insulating film 10. However, a buffer electrode 13 electrically connected to an emitter electrode 12 is disposed on that portion of the p-buffer layer 9, which corresponds to a position beyond the end of n-emitter layers 8 in the channel width direction. Accordingly, the buffer resistor 14 includes a lateral resistance of the p-buffer layer 9 as a main component, on the route from that portion of the p-buffer layer 9, which faces the n-emitter layers 8, to the buffer electrode 13.

The buffer electrode 13 may be disposed in each of portions, such as junction termination regions, cell peripheral regions, or portions near gate lead electrodes 15 disposed at predetermined intervals in the chip. The resistance value of the buffer resistor 14 can be easily preset by adjusting the impurity concentration in the p-buffer layer 9 (e.g., to be a predetermined value or less)

(Third Embodiment)

Figure 7:
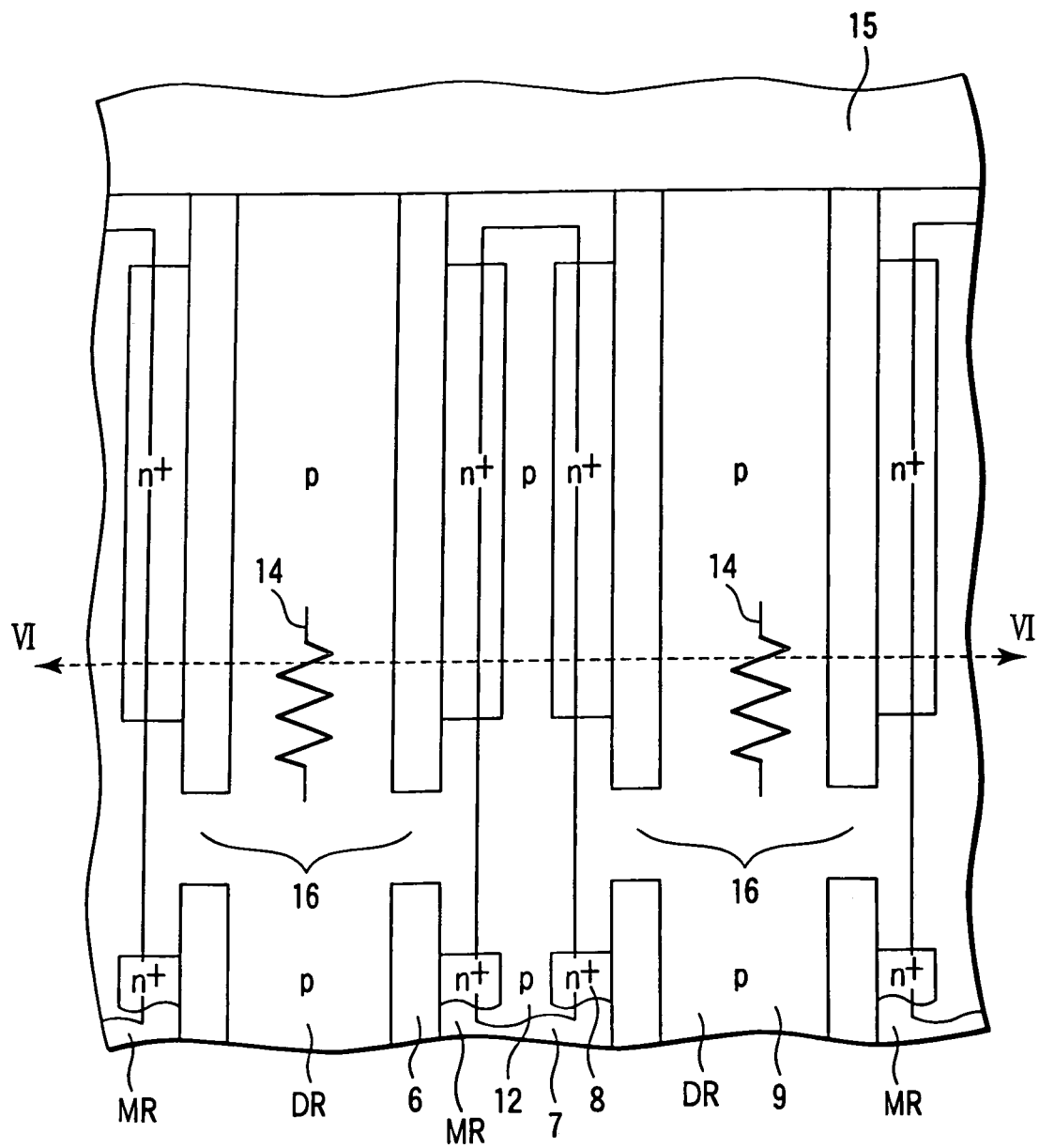
FIG. 7 is a view showing the plan layout of a power semiconductor device (IEGT) according to a third embodiment of the present invention.

FIG. 7 is a view showing the plan layout of a power semiconductor device (IEGT) according to a third embodiment of the present invention. The sectional view taken along line VI—VI in FIG. 7 is the same as that shown in FIG. 6. This embodiment also adopts a buffer resistor 14 mainly employing a lateral resistance of a p-buffer layer 9.

Specifically, each of trenches 4 including a gate electrode 6 is cut at predetermined intervals, while an emitter electrode 12 is continuously formed on each of main cells MR including the cut portion of the trench 4. The p-buffer layer 9 is electrically connected to the emitter electrode 12 through a p-connection layer 16 present at the cut portion of the trench 4. Accordingly, the buffer resistor 14 includes a lateral resistance of the p-buffer layer 9 as a main component, on the route from that portion of the p-buffer layer 9, which faces n-emitter layers 8, to the emitter electrode 12 through the p-connection layer 16.

In this embodiment, the p-connection layer 16 is part of a layer common to a p-base layer 7 and p-buffer layer 9. In this respect, the p-connection layer 16 is not limited to a specific formation manner, so long as it electrically connects the p-buffer layer 9 to the p-base layer 7 at a position beyond the end of the gate electrode 6 in the channel width direction.

(Fourth Embodiment)

Figure 8:
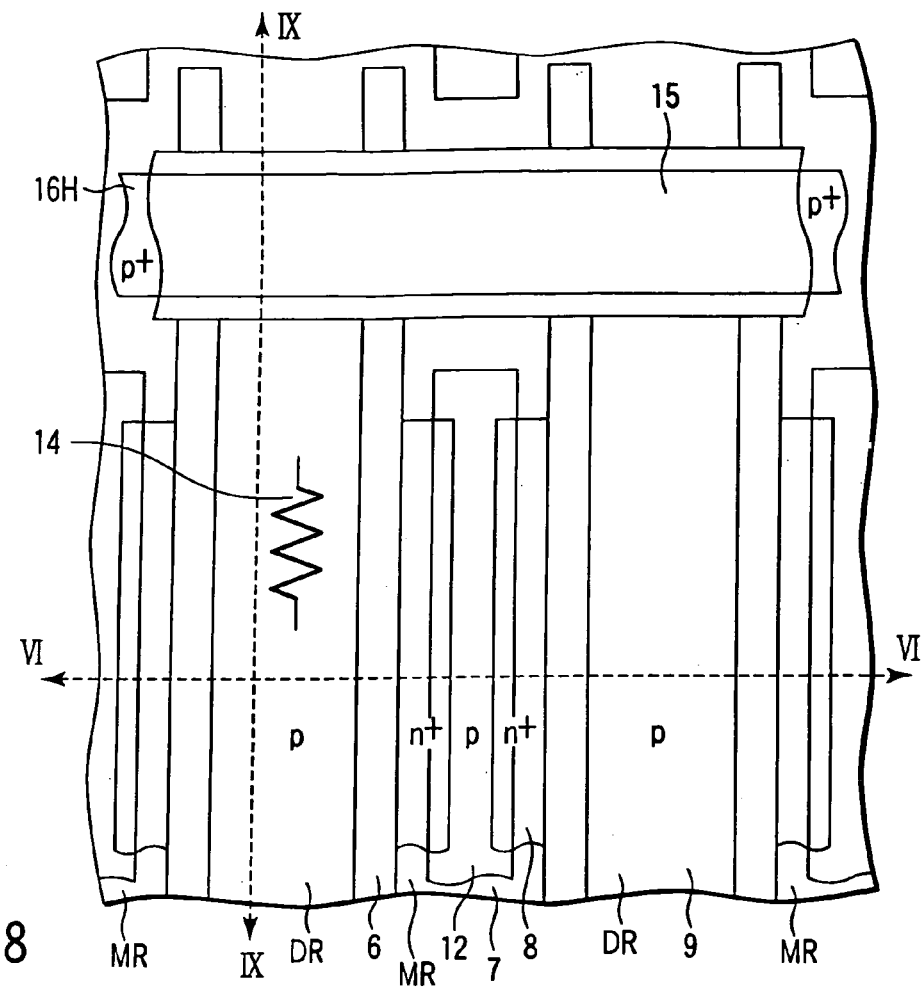
FIG. 8 is a view showing the plan layout of a power semiconductor device (IEGT) according to a fourth embodiment of the present invention.
Figure 9:
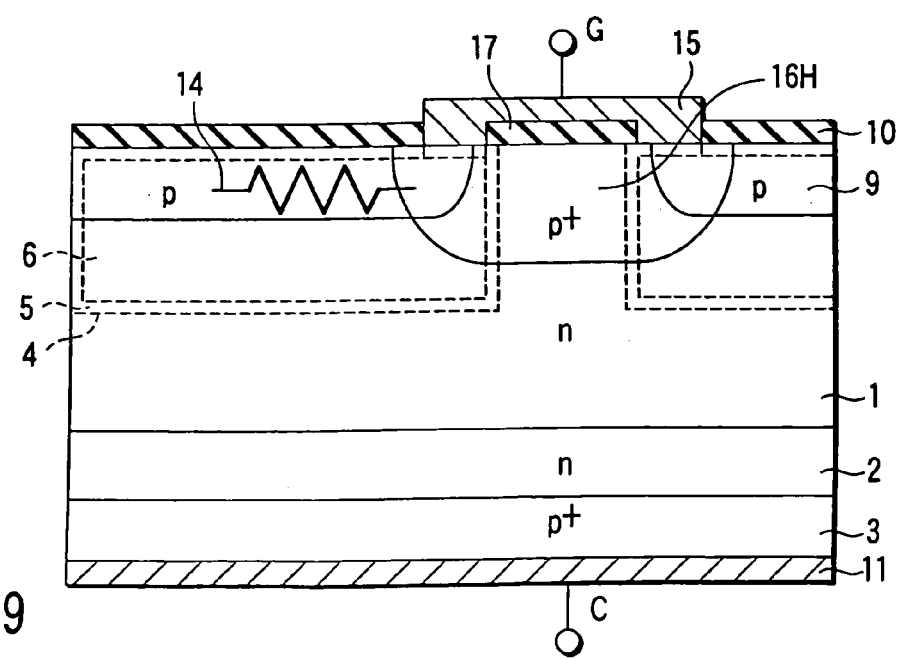
FIG. 9 is a sectional view taken along line IX—IX in FIG. 8.

FIG. 8 is a view showing the plan layout of a power semiconductor device (IEGT) according to a fourth embodiment of the present invention. FIG. 9 is a sectional view taken along line IX—IX in FIG. 8. The sectional view taken along line VI—VI in FIG. 8 is the same as that shown in FIG. 6. This embodiment also adopts a buffer resistor 14 mainly employing a lateral resistance of a p-buffer layer 9.

Specifically, each of trenches 4 including a gate electrode 6 and each of emitter electrodes 12 are cut at predetermined intervals. A p-connection layer 16H having a high impurity concentration is formed at the cut portions of the trenches 4, and electrically connects the p-buffer layer 9 to a p-base layer 7. Accordingly, the buffer resistor 14 includes a lateral resistance of the p-buffer layer 9 and p-base layer 7 as a main component, on the route from that portion of the p-buffer layer 9, which faces n-emitter layers 8, to the emitter electrode 12 through the p-connection layer 16H and p-base layer 7.

For example, the p-connection layer 16H may be disposed, through an insulating film 17, below each of gate lead electrodes 15 disposed at predetermined intervals in the chip.

(Fifth Embodiment)

Figure 10:
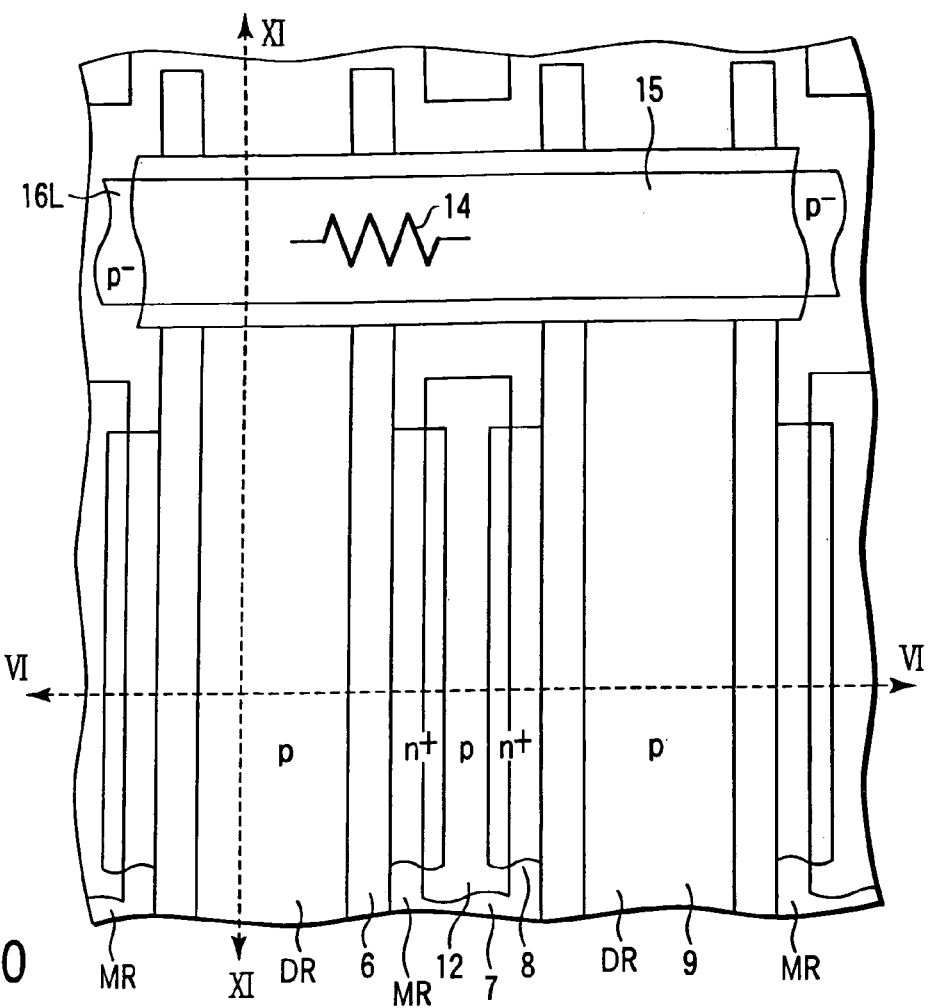
FIG. 10 is a view showing the plan layout of a power semiconductor device (IEGT) according to a fifth embodiment of the present invention.
Figure 11:
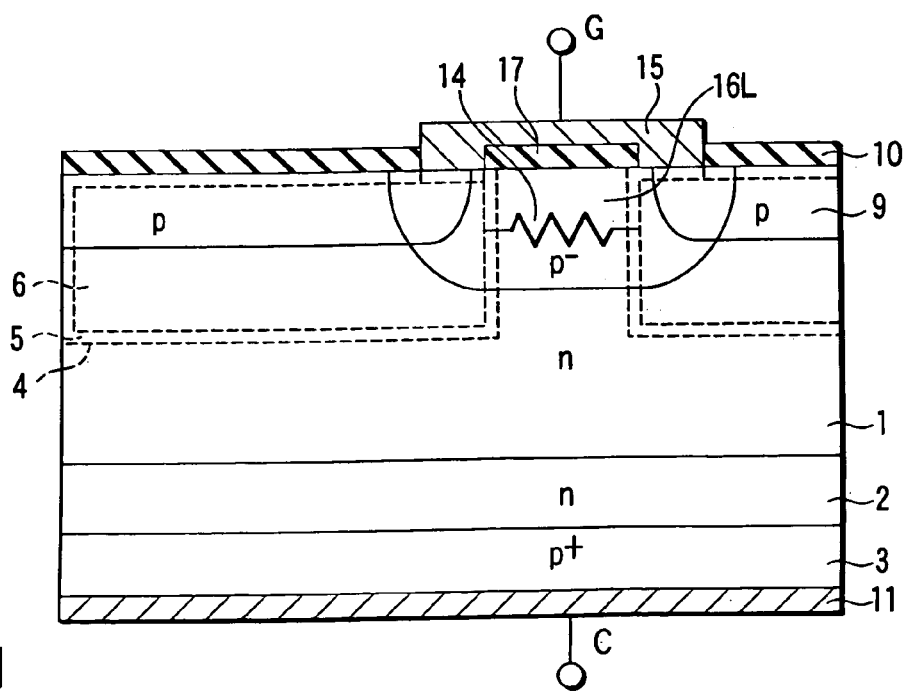
FIG. 11 is a sectional view taken along line XI—XI in FIG. 10.

FIG. 10 is a view showing the plan layout of a power semiconductor device (IEGT) according to a fifth embodiment of the present invention. FIG. 11 is a sectional view taken along line XI—XI in FIG. 10. The sectional view taken along line VI—VI in FIG. 10 is the same as that shown in FIG. 6. This embodiment adopts a buffer resistor 14 mainly employing a lateral resistance of a p-buffer layer 9, and a p-connection layer 16L having a low impurity concentration.

Specifically, each of trenches 4 including a gate electrode 6 and each of emitter electrodes 12 are cut at predetermined intervals. A p-connection layer 16L having a low impurity concentration is formed at the cut portions of the trenches 4, and electrically connects the p-buffer layer 9 to a p-base layer 7. Accordingly, the buffer resistor 14 includes a lateral resistance of the p-connection layer 16L as a main component, on the route from that portion of the p-buffer layer 9, which faces n-emitter layers 8, to the emitter electrode 12 through the p-connection layer 16L and p-base layer 7.

For example, the p-connection layer 16L may be disposed, through an insulating film 17, below each of gate lead electrodes 15 disposed at predetermined intervals in the chip. The resistance value of the buffer resistor 14 can be easily preset by adjusting the impurity concentration in the p-connection layer 16L.

(Sixth Embodiment)

Figure 12:
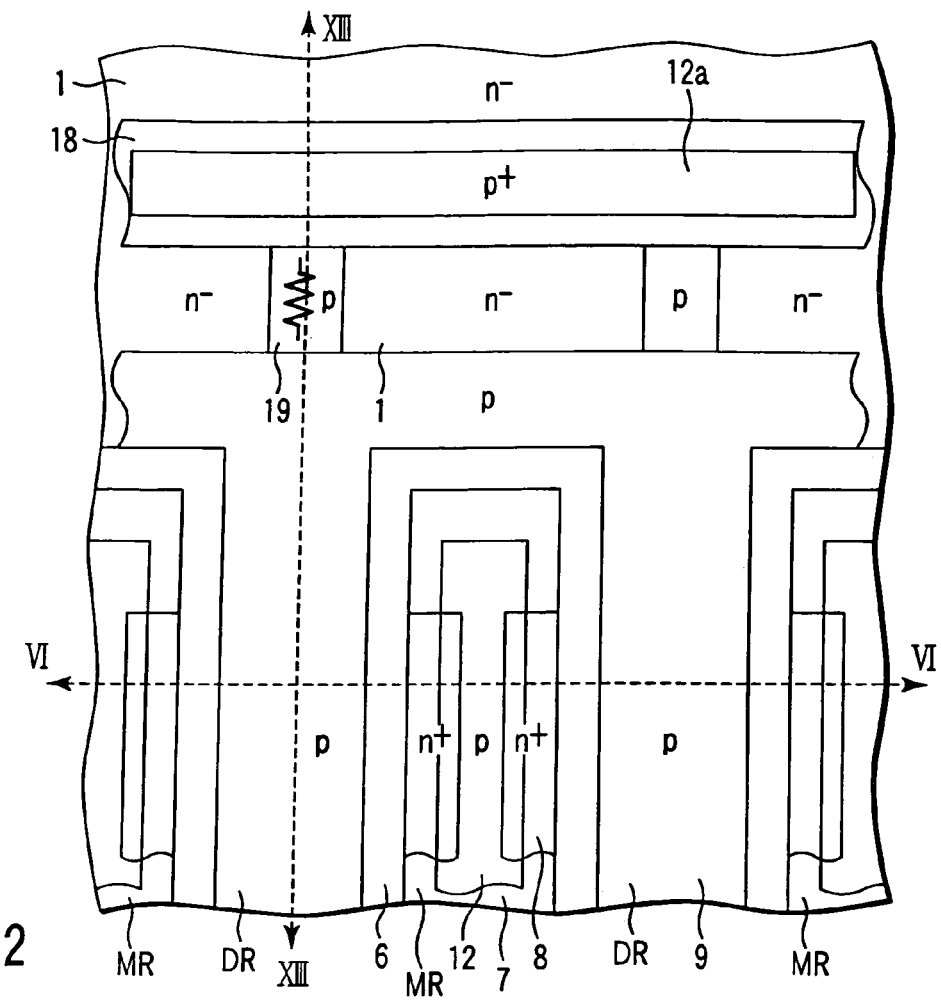
FIG. 12 is a view showing the plan layout of a power semiconductor device (IEGT) according to a sixth embodiment of the present invention.
Figure 13:
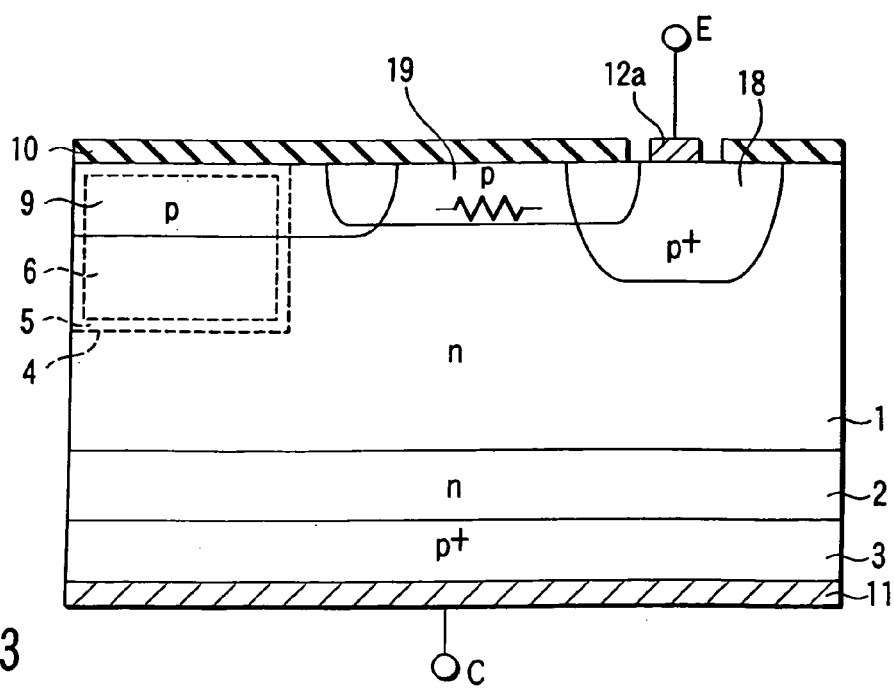
FIG. 13 is a sectional view taken along line XIII—XIII in FIG. 12.

FIG. 12 is a view showing the plan layout of a power semiconductor device (IEGT) according to a sixth embodiment of the present invention. FIG. 13 is a sectional view taken along line XIII—XIII in FIG. 12. The sectional view taken along line VI—VI in FIG. 12 is the same as that shown in FIG. 6. This embodiment adopts a buffer resistor 14 mainly employing a lateral resistance of a p-buffer layer 9 and p-extension layer 19.

Specifically, a p-layer 18 having a high impurity concentration is formed at position beyond the end of gate electrodes 6 in the channel width direction. An additional electrode 12a electrically connected to emitter electrodes 12 is disposed on the p-layer 18. The p-buffer layer 9 is electrically connected to the p-layer 18 through each of p-extension layers 19 formed in a predetermined pattern. Accordingly, the buffer resistor 14 includes a lateral resistance of the p-buffer layer 9 and p-extension layer 19 as a main component, on the route from that portion of the p-buffer layer 9, which faces n-emitter layers 8, to the additional electrode 12a through the p-extension layer 19 and p-layer 18.

For example, the p-layer 18 and an additional electrode 12a may be a p-guard ring layer and ring electrode, respectively, disposed on each of junction termination regions. The resistance value of the buffer resistor 14 can be easily preset by adjusting the impurity concentration in the p-extension layer 19.

(Seventh Embodiment)

Figure 14:
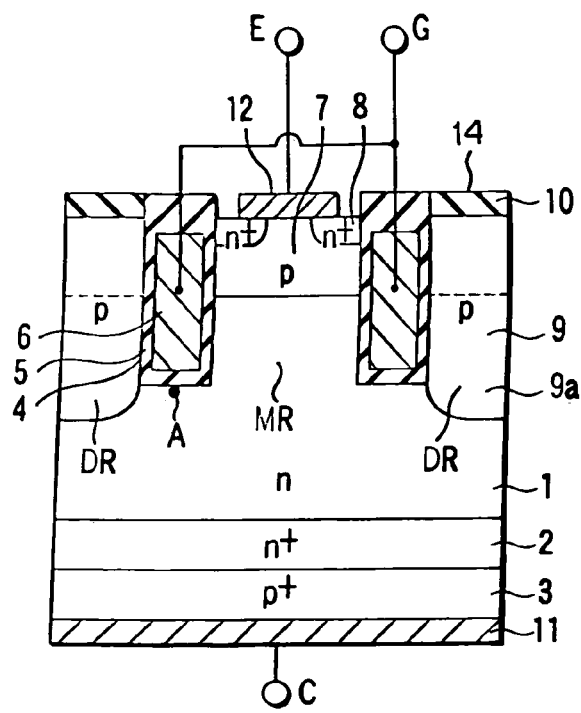
FIG. 14 is a sectional view showing a power semiconductor device (IEGT) according to a seventh embodiment of the present invention.

FIG. 14 is a sectional view showing a power semiconductor device (IEGT) according to a seventh embodiment of the present invention. This embodiment adopts a buffer resistor 14 having an infinitely large resistance value. In addition, each of dummy cells DR is provided with an inhibiting structure for reducing the quantity of holes to flow to and accumulate in an inter-trench region of the dummy cell, and particularly in the p-buffer layer 9, as compared to a case where a p-base layer 7 and p-buffer layer 9 are formed with the same impurity concentration and depth. The inhibiting structure is arranged to inhibit holes from flowing in the inter-trench region of the dummy cell from a p-collector layer 3, in the first period of time in the process of turn-on of the IEGT, i.e., a period of time for the applied voltage between the gate and emitter to charge the capacity between the gate and emitter.

Specifically, the surface of the p-buffer layer 9 in each of the dummy cells DR is covered with an insulating film 10. The p-buffer layer 9 is not electrically connected to a p-base layer 7 or emitter electrode 12 at any region of the IEGT, but is in a completely floating state. Furthermore, in order to form the inhibiting structure, the p-buffer layer 9 has an additionally deep portion 9a, so that the pn junction between an n-base layer 1 and p-buffer layer 9 is positioned deeper than a trench 4 including a gate electrode 6. The impurity concentration in the p-buffer layer 9 adjacent to the bottom of the trench 4 is set at $1 \times 10^{14}$ cm$^{-3}$ or more, and, e.g., about $1 \times 10^{15}$ cm$^{-3}$. The difference in depth between the bottom of the trench 4 and the deepest portion of the pn junction between the n-base layer 1 and p-buffer layer 9 is set at 0.5 µm or more, and preferably 1 µm or more.

FIGS. 15A and 15B are graphs obtained by experiments and showing voltage and current waveforms in the turn-on of an IEGT according to a comparative example 2, and an IEGT according to a present example 2 of the seventh embodiment, respectively. In FIGS. 15A and 15B, Vge stands for the gate-emitter voltage, Vce for the collector-emitter voltage, and Ic for the collector current.

In the experiments, both the IEGTs according to the comparative example 2 and present example 2 were provided with a breakdown voltage of 1,200V, an applied voltage of 600V between the collector and emitter, a gate resistance Rg of 51 Ω, an infinitely large resistance between the p-buffer layer 9 and emitter electrode 12, and an impurity concentration of about $1 \times 10^{15}$ cm$^{-3}$ in the p-buffer layer 9 adjacent to the bottom of the trench 4. The difference in depth between the bottom of the trench 4 and the deepest portion of the pn junction between the n-base layer 1 and p-buffer layer 9 was 0 µm in the comparative example 2, and 1.5 µm in the present example 2.

As shown in FIG. 15A, in the IEGT according to the comparative example 2, the dV/dt was as small as about 1 kV/µs in the Miller period t1 to t2, thereby causing the Miller period to be 2.5 µs or more, resulting in a slow turn-on. On the other hand, as shown in FIG. 15B, in the IEGT according to the present example 2, the dV/dt was moderately about 3.5 kV/µs in the Miller period t1 to t2, thereby causing the Miller period to be 1.5 µs, resulting in a fast turn-on.

Figure 16:
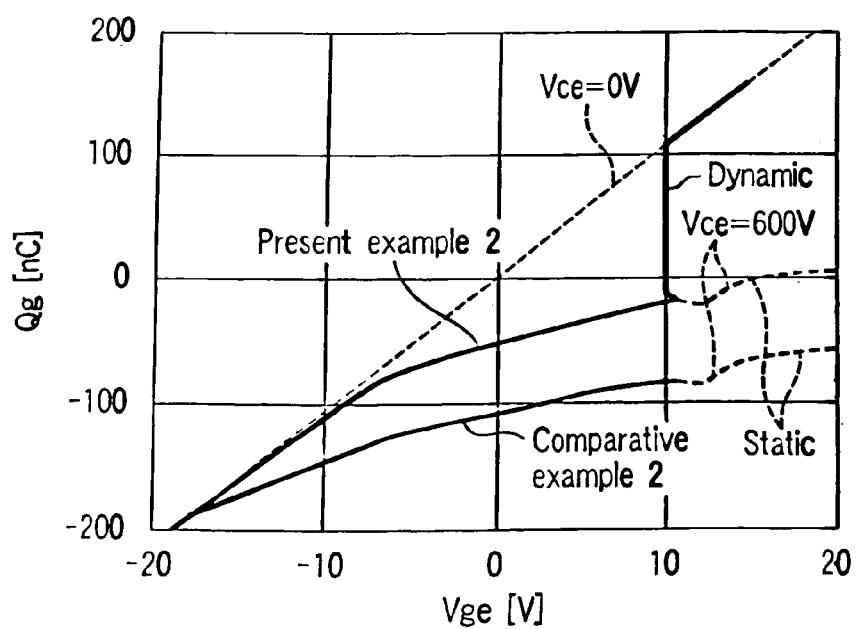
FIG. 16 is a graph obtained by simulations and showing gate charge characteristics in the turn-on of the IEGT according to the comparative example 2, and the IEGT according to the present example 2.

FIG. 16 is a graph obtained by simulations and showing gate charge characteristics in the turn-on of the IEGT according to the comparative example 2, and the IEGT according to the present example 2. In FIG. 16, Vge stands for the gate-emitter voltage, Vce for the collector-emitter voltage, and Qg for the gate charge. Furthermore, solid lines show characteristics obtained by dynamic calculation, while broken lines show characteristics obtained by static calculation (Vce=0V and Vce=600V). The conditions on the IEGTs in the simulations were the same as those explained with reference to FIGS. 15A and 15B, except for parameters of the simulations.

In the IEGT according to the comparative example 2, the line of Vce=600V separates from the line of Vce=0V at Vge=about −20V. On the other hand, in the IEGT according to the present example 2, the line of Vce=600V do not separate from the line of Vce=0V until Vge=about −7.5V. As a consequence, the line of the IEGT according to the comparative example 2 shifts toward the smaller value side of the gate charge (Qg), thereby prolonging the Miller period, as compared to the line of the IEGT according to the present example 2. This means that the IEGT according to the comparative example 2 holds a larger quantity of positive charge that has to be discharged. The present inventors have researched and found the following matters as regards the relationship between the Miller period length and the dummy cells DR of an IEGT.

In the IEGT according to the comparative example 2, a large quantity of holes flow into the p-buffer layer 9 from the p-collector layer 3 through the n-base layer 1, thereby gradually increasing the potential of the p-buffer layer 9, in the first period of time in the process of turn-on, i.e., a period of time for the applied voltage between the gate and emitter (mainly a negative voltage in this period of time) to charge the capacity between the gate and emitter. An increase in the potential of the p-buffer layer 9 affects a p-channel MOSFET structured of the p-buffer layer 9, n-base layer 1, p-base layer 7, and insulated gate electrode 6. Specifically, due to an increase in the potential of the p-buffer layer 9, the p-channel of the p-channel MOSFET is pinched off, at the bottom of the trench 4 (the position indicated with point A in FIG. 14), at the early stage of the first period of time in the process of turn-on. As a consequence, holes are not exhausted from the p-buffer layer 9, but holes of the $10^{18}$-order remain at the interface between the p-buffer layer 9 and trench 4.

On the other hand, in the IEGT according to the present example 2, since the p-buffer layer 9 is formed deeper than the trench 4, the quantity of holes to flow to and accumulate in the p-buffer layer 9 from the p-collector layer 3 through the n-base layer 1 decreases, in the first period of time in the process of turn-on. This is so, because an increase in the potential of the p-buffer layer 9 and an increase in the potential at the bottom of the trench (the position indicated with point A in FIG. 14) caused thereby are suppressed. As a consequence, the p-channel MOSFET can operate until the late stage of the first period of time in the process of turn-on, thereby further reducing the quantity of holes to accumulate in the p-buffer layer 9.

As described above, the IEGT according to this embodiment can provide a high speed switching characteristic while maintaining a low on-state voltage characteristic. In the turn-on of the IEGT, the voltage change rate (dV/dt) between the collector and emitter is optimized, and the dV/dt is adjustable by the gate resistance.

(Eighth Embodiment)

Figure 17:
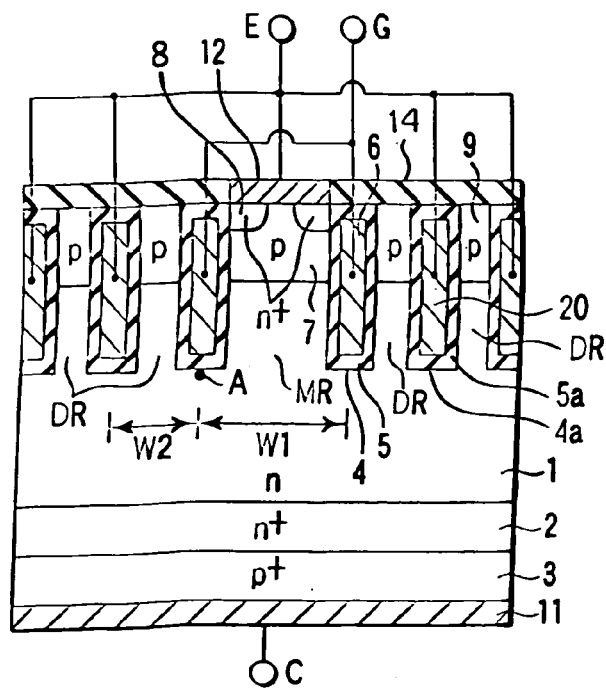
FIG. 17 is a sectional view showing a power semiconductor device (IEGT) according to an eighth embodiment of the present invention.

FIG. 17 is a sectional view showing a power semiconductor device (IEGT) according to an eighth embodiment of the present invention. This embodiment also adopts a p-buffer layer 9 preset in a completely floating state (there is a buffer resistor 14 having an infinitely large resistance value). In addition, the width of dummy cells DR is smaller than that of main cells MR, to form an inhibiting structure for inhibiting holes from flowing in the p-buffer layer 9 from an n-base layer 1.

Specifically, the main cells MR and dummy cells DR are not alternately disposed, but a plurality of dummy cells DR with a small width are disposed in series next to one main cell MR. Trenches 4 and 4a for partitioning the main cells MR and dummy cells DR have the same depth, while being disposed at different intervals. Where the interval (between the centers) of a pair of trenches 4 sandwiching one main cell MR is W1, and the interval (between the centers) of a pair of trenches 4 and 4a sandwiching one dummy cell DR is W2, W2/W1 is set at ⅔ or less, and preferably at ½ or less.

The trench 4 adjacent to the main cell MR is provided with a gate electrode 6 buried therein, while it is wrapped in a gate insulating film 5. On the other hand, the trench 4a adjacent only to the dummy cell DR is provided with a dummy electrode 20 buried therein, while it is wrapped in an insulating film 5a. The dummy electrode 20 is electrically connected to an emitter electrode 12. In this respect, the dummy electrode 20 may be electrically connected not to the emitter electrode 12, but to the gate electrode 6.

Since the width of the dummy cells DR is smaller, the quantity of holes flowing in the p-buffer layer 9 from the n-base layer 1 decreases in the first period of time in the process of turn-on. As a consequence, the potential of the p-buffer layer 9 is prevented from increasing in the process of turn-on of the IEGT, thereby providing a high speed switching characteristic while maintaining a low on-state voltage characteristic.

(Ninth Embodiment)

Figure 18:
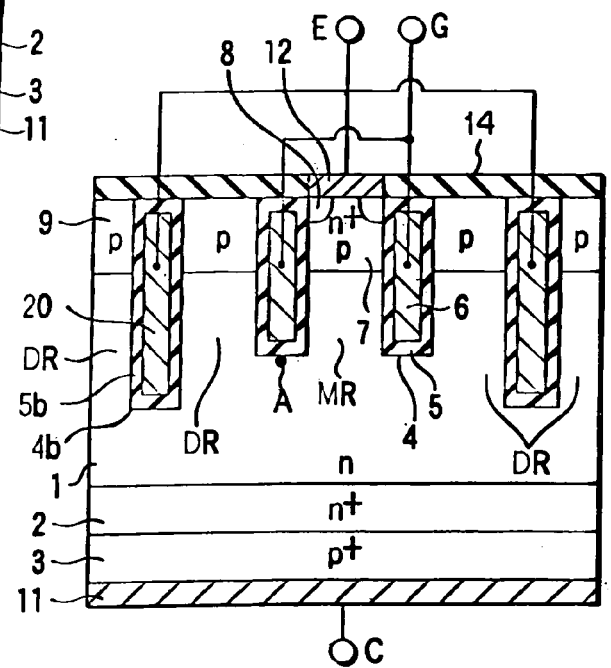
FIG. 18 is a sectional view showing a power semiconductor device (IEGT) according to a ninth embodiment of the present invention.

FIG. 18 is a sectional view showing a power semiconductor device (IEGT) according to a ninth embodiment of the present invention. This embodiment also adopts a p-buffer layer 9 preset in a completely floating state (there is a buffer resistor 14 having an infinitely large resistance value). In addition, the depth of trenches for dummy cells DR is larger than that of trenches for main cells MR, to form an inhibiting structure for inhibiting holes from flowing in the p-buffer layer 9 from an n-base layer 1.

Specifically, the main cells MR and dummy cells DR are not alternately disposed, but a plurality of dummy cells DR with a deeper trench 4b are disposed in series next to one main cell MR. Trenches 4 and 4b for partitioning the main cells MR and dummy cells DR are disposed at constant intervals, while having different depths. Where the depth of trenches 4 adjacent to the main cells MR is D1, and the depth of trenches 4b adjacent only to the dummy cell DR is D2, (D2−D1) is set at 1 µm or more, and preferably at 1.5 µm or more.

The trench 4 adjacent to the main cell MR is provided with a gate electrode 6 buried therein, while it is wrapped in a gate insulating film 5. On the other hand, the trench 4b adjacent only to the dummy cell DR is provided with a dummy electrode 20 buried therein, while it is wrapped in an insulating film 5b. The dummy electrode 20 is electrically connected to an emitter electrode 12. In this respect, the dummy electrode 20 may be electrically connected not to the emitter electrode 12, but to the gate electrode 6.

Since the depth of the trenches 4b for the dummy cells DR is larger, the quantity of holes flowing in the p-buffer layer 9 from the n-base layer 1 decreases in the first period of time in the process of turn-on. As a consequence, the potential of the p-buffer layer 9 is prevented from increasing in the process of turn-on of the IEGT, thereby providing a high speed switching characteristic while maintaining a low on-state voltage characteristic.

(Tenth Embodiment)

Figure 19:
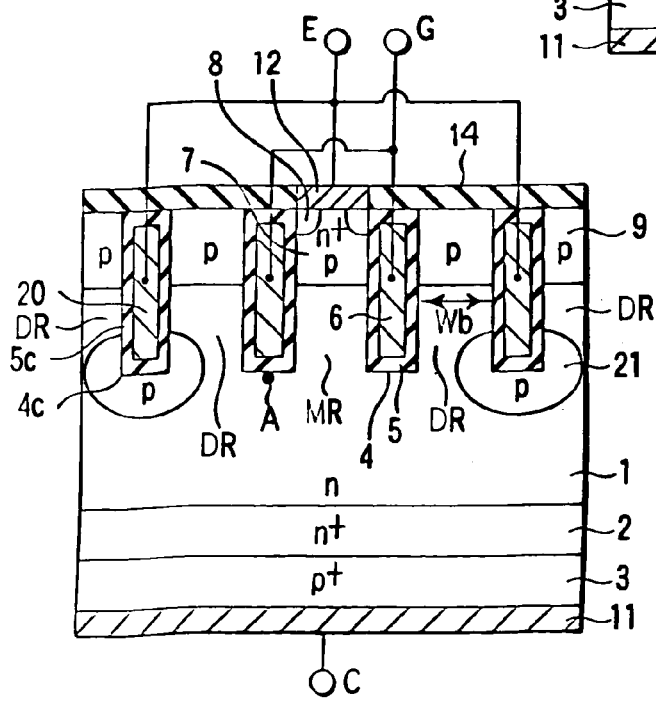
FIG. 19 is a sectional view showing a power semiconductor device (IEGT) according to a tenth embodiment of the present invention.

FIG. 19 is a sectional view showing a power semiconductor device (IEGT) according to a tenth embodiment of the present invention. This embodiment also adopts a p-buffer layer 9 preset in a completely floating state (there is a buffer resistor 14 having an infinitely large resistance value). In addition, p-projecting layers are formed in an n-base layer 1 and respectively in contact with the bottoms of trenches for dummy cells DR, to form an inhibiting structure for inhibiting holes from flowing in the p-buffer layer 9 from an n-base layer 1.

Specifically, the main cells MR and dummy cells DR are not alternately disposed, but a plurality of dummy cells DR are disposed in series next to one main cell MR. Trenches 4 and 4c for partitioning the main cells MR and dummy cells DR are disposed at constant intervals, while having the same depth. However, the trench 4c adjacent only to the dummy cell DR is provided with a p-projecting layer 21 formed in the n-base layer 1, wherein the p-projecting layer 21 is in contact with the bottom of the trench 4c and projects into the dummy cell DR. The p-projecting layer 21 reaches a depth of 1 µm or more, and preferably of 1.5 µm or more, from the bottom of the trench 4c. The p-projecting layer 21 may be formed by, e.g., a method of ion-implanting a p-type impurity into the bottom of the trench 4c, and thermally diffusing it, following formation of the trench 4c.

The trench 4 adjacent to the main cell MR is provided with a gate electrode 6 buried therein, while it is wrapped in a gate insulating film 5. On the other hand, the trench 4c adjacent only to the dummy cell DR is provided with a dummy electrode 20 buried therein, while it is wrapped in an insulating film 5c. The dummy electrode 20 is electrically connected to an emitter electrode 12. In this respect, the dummy electrode 20 may be electrically connected not to the emitter electrode 12, but to the gate electrode 6.

Since the p-projecting layer 21 is disposed at the bottom of each of the trenches 4c for the dummy cells DR, the quantity of holes flowing in the p-buffer layer 9 from the n-base layer 1 decreases in the first period of time in the process of turn-on. As a consequence, the potential of the p-buffer layer 9 is prevented from increasing in the process of turn-on of the IEGT, thereby providing a high speed switching characteristic while maintaining a low on-state voltage characteristic.

(Eleventh Embodiment)

Figure 20:
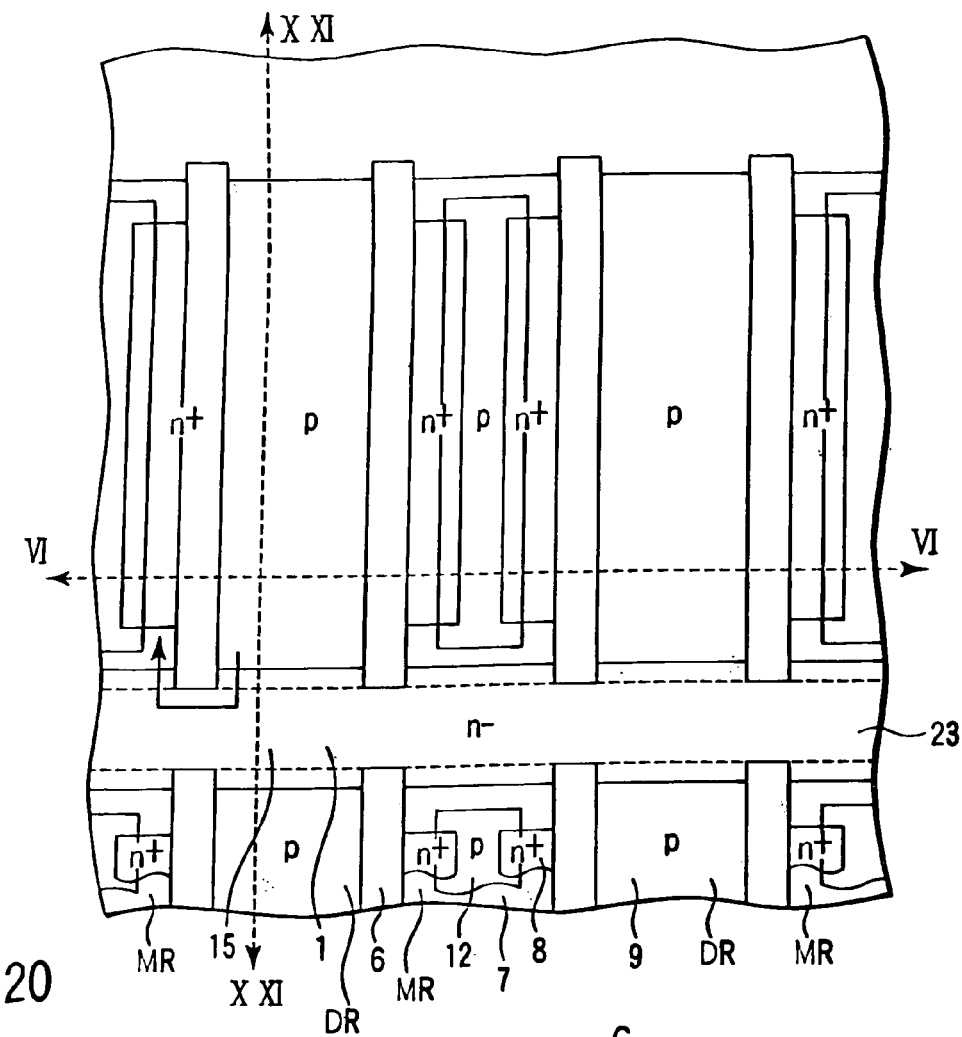
FIG. 20 is a view showing the plan layout of a power semiconductor device (IEGT) according to an eleventh embodiment of the present invention.
Figure 21:
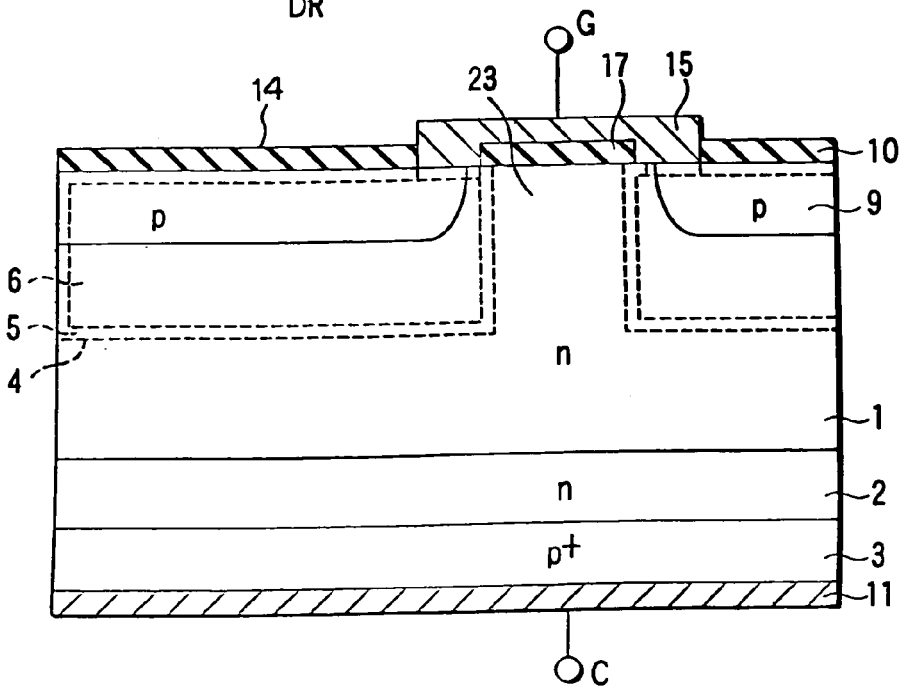
FIG. 21 is a sectional view taken along line XXI—XXI in FIG. 20.

FIG. 20 is a view showing the plan layout of a power semiconductor device (IEGT) according to an eleventh embodiment of the present invention. FIG. 21 is a sectional view taken along line XXI—XXI in FIG. 20. The sectional view taken along line VI—VI in FIG. 20 is the same as that shown in FIG. 6. This embodiment adopts a buffer resistor 14 having an infinitely large resistance value. In addition, a switching element for selectively connecting a p-buffer layer 9 to a p-base layer 7 is formed at a position beyond the end of a gate electrode 6 in the channel width direction. The switching element is arranged to exhaust holes from the p-buffer layer 9 to the p-base layer 7, in the first period of time in the process of turn-on of the IEGT, i.e., a period of time for the applied voltage between the gate and emitter to charge the capacity between the gate and emitter.

Specifically, the surface of the p-buffer layer 9 in each of the dummy cells DR is covered with an insulating film 10. The p-buffer layer 9 is not electrically connected to the p-base layer 7 or emitter electrode 12 at any region of the IEGT, but is in a completely floating state. Furthermore, the trenches 4 each including the gate electrode 6, and the emitter electrodes 12 are cut at predetermined intervals, and a band-like n-intermediate layer 23 is disposed at the cut portions. The n-intermediate layer 23 is disposed, through an insulating film 17, below each of gate lead electrodes 15, which are disposed at predetermined intervals in the chip.

A p-inversion layer is induced in that portion of the n-intermediate layer 23, which faces an end portion of the gate electrode 6 and the gate lead electrode 15, when a negative voltage is applied to these electrodes. As a result, a p-channel MOSFET (the switching element described above) is formed between the p-base layer 7 and p-buffer layer 9, using the n-intermediate layer 23 as a channel region, and the end portion of the gate electrode 6 and the gate lead electrode 15 as a driving electrode.

In this embodiment, the n-intermediate layer 23 is formed of part of the n-base layer 1 having a low impurity concentration. In this respect, the n-intermediate layer 23 may not be part of the n-base layer 1, but may be any n-layer, so long as it is present between the p-base layer 7 and p-buffer layer 9 at a position facing an end portion of the gate electrode 6 in the channel width direction. Since the p-channel MOSFET can be operated, using an end portion of the gate electrode 6 as a driving electrode, the n-intermediate layer 23 does not have to be disposed to correspond to the gate lead electrode 15.

In the IEGT according to this embodiment, holes are exhausted from the p-buffer layer 9 to the p-base layer 7 through the p-channel MOSFET, in the first period of time in the process of turn-on, i.e., a period of time for the applied voltage between the gate and emitter (mainly a negative voltage in this period of time) to charge the capacity between the gate and emitter. Consequently, the quantity of holes to accumulate in the p-buffer layer 9 decreases, in the first period of time in the process of turn-on. As a result, as described with reference to FIG. 15B, the dV/dt becomes moderate in the Miller period, thereby shortening the Miller period, and resulting in a fast turn-on.

As described above, the IEGT according to this embodiment can provide a high speed switching characteristic while maintaining a low on-state voltage characteristic. In the turn-on of the IEGT, the voltage change rate (dV/dt) between the collector and emitter is optimized, and the dV/dt is adjustable by the gate resistance.

(Twelfth Embodiment)

Figure 22:
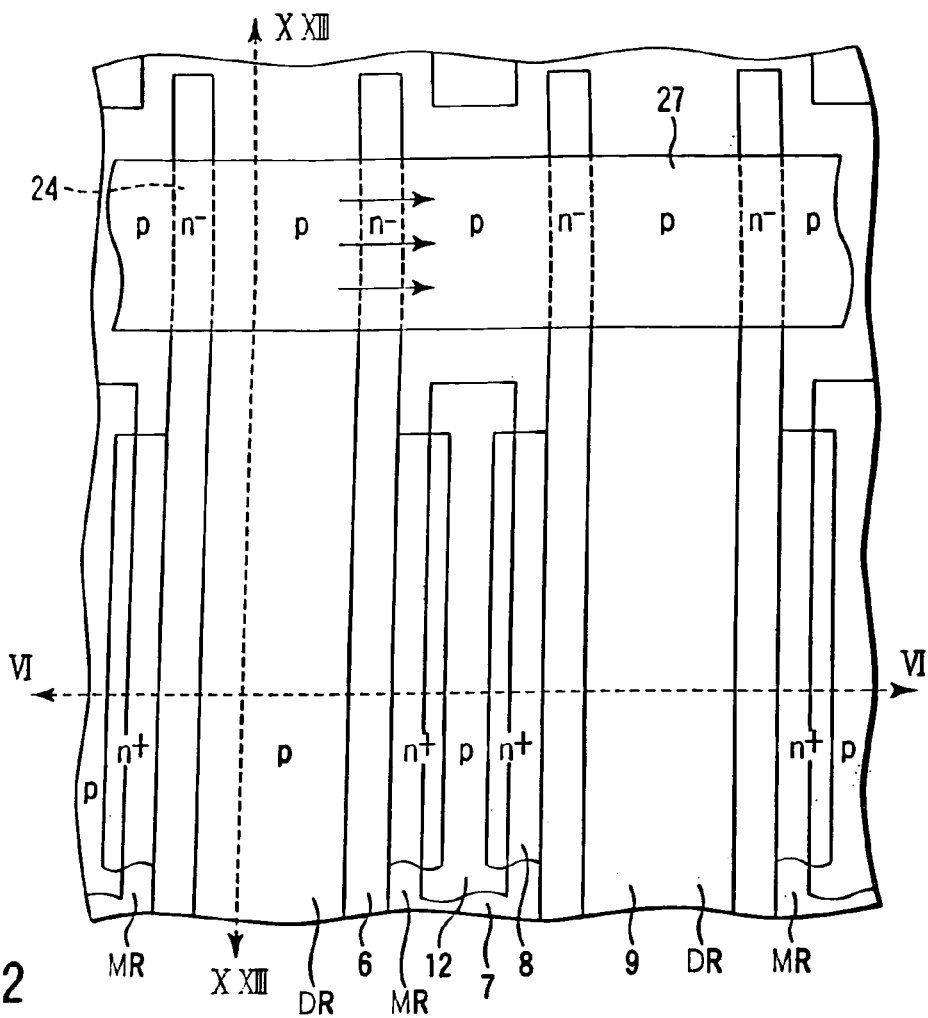
FIG. 22 is a view showing the plan layout of a power semiconductor device (IEGT) according to a twelfth embodiment of the present invention.
Figure 23:
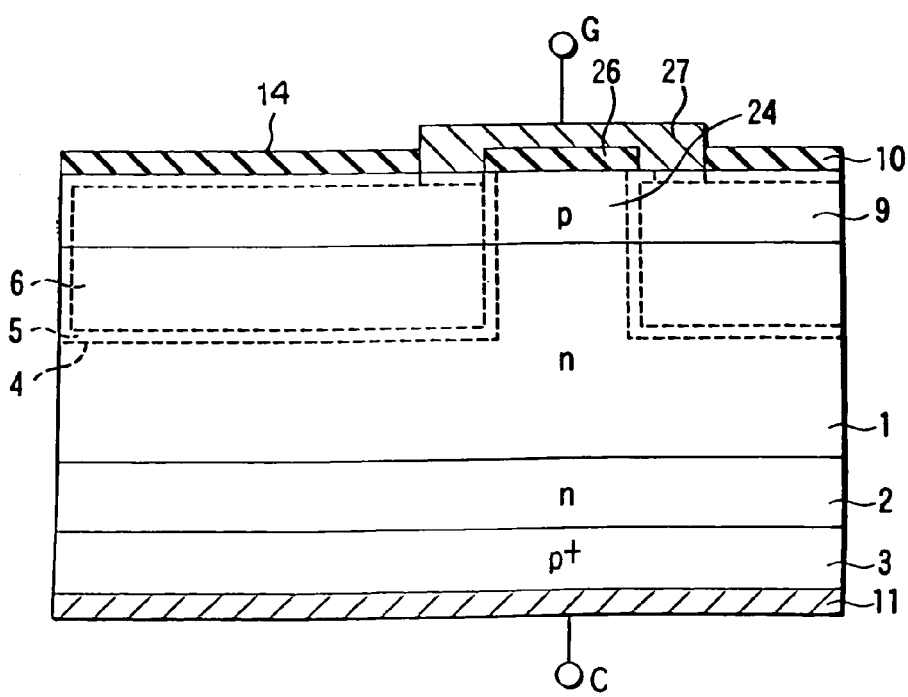
FIG. 23 is a sectional view taken along line XXIII—XXIII in FIG. 22.

FIG. 22 is a view showing the plan layout of a power semiconductor device (IEGT) according to an twelfth embodiment of the present invention. FIG. 23 is a sectional view taken along line XXIII—XXIII in FIG. 22. The sectional view taken along line VI—VI in FIG. 22 is the same as that shown in FIG. 6. This embodiment also adopts a buffer resistor 14 having an infinitely large resistance value. In addition, a switching element for selectively connecting a p-buffer layer 9 to a p-base layer 7 is formed of a p-channel MOSFET having a gate electrode of the planar type.

Specifically, trenches 4 each including a gate electrode 6, and emitter electrodes 12 are cut at predetermined intervals, and an n-intermediate layer 24 having a width of one trench 4 is disposed at the cut portion of each trench 4. A band-like gate electrode 27 is disposed on the n-intermediate layers 24 through an insulating film 26. As a result, a p-channel MOSFET (the switching element described above) is formed between the p-base layer 7 and p-buffer layer 9, using the n-intermediate layer 24 as a channel region, and the gate electrode 27 as a driving electrode.

Also in the IEGT according to this embodiment, holes are exhausted from the p-buffer layer 9 to the p-base layer 7 through the p-channel MOSFET, in the first period of time in the process of turn-on. As a result, it can provide a high speed switching characteristic while maintaining a low on-state voltage characteristic.

(Thirteenth Embodiment)

Figure 24:
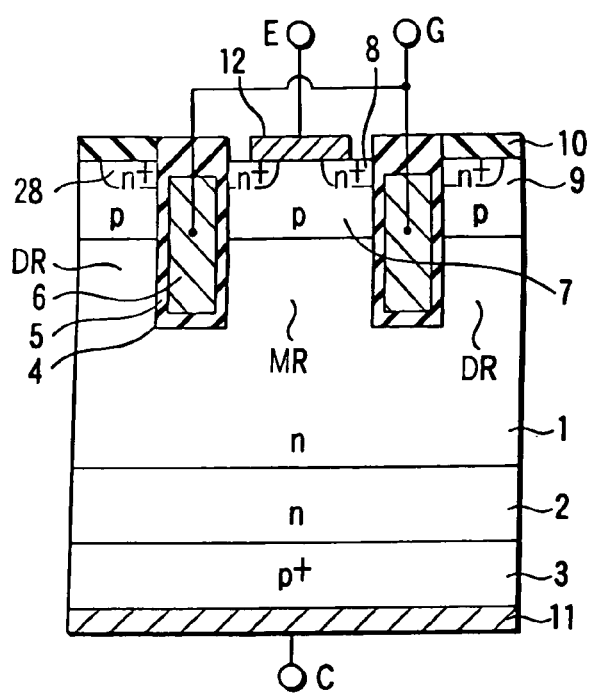
FIG. 24 is a sectional view showing a power semiconductor device (IEGT) according to a thirteenth embodiment of the present invention.

FIG. 24 is a sectional view showing a power semiconductor device (IEGT) according to a thirteenth embodiment of the present invention. This embodiment relates to a modification of the first to twelfth embodiments. The sectional view shown in FIG. 24 corresponds to that shown in FIG. 6.

Specifically, n-layers 28 are formed in the surface of a p-buffer layer 9 in each of dummy cells DR. The n-layers 28 are formed along with n-emitter layers 8, which are formed in the surface of a p-base layer 7 in each of main cells MR, in the same step. In other words, the n-layers 28 are substantially the same as the n-emitter layers 8. This arrangement allows a process of manufacturing the IEGT to be easier. Where a buffer resistor 14 is formed to use a lateral resistance of the p-buffer layer 9, the n-layers 28 may be utilized to adjust the resistance value of the buffer resistor 14.

(Fourteenth Embodiment)

Figure 27:
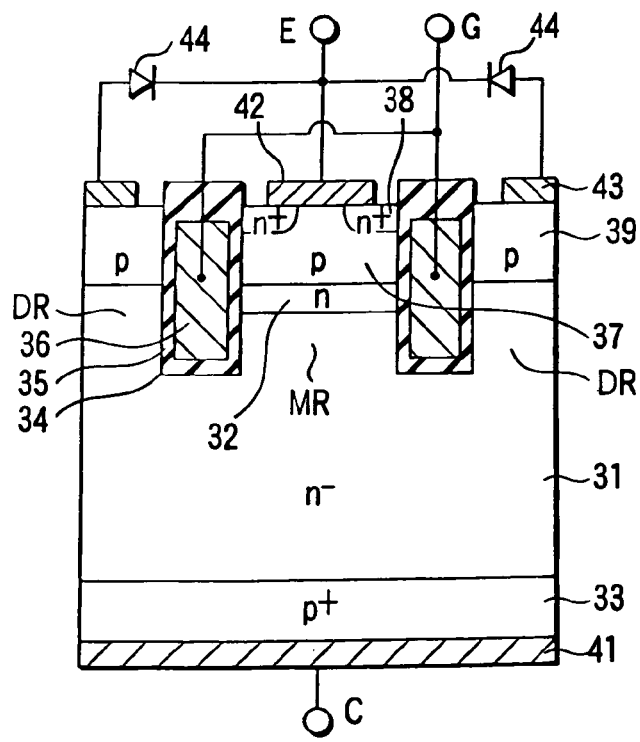
FIG. 27 is a sectional view showing a power semiconductor device according to a fourteenth embodiment of the present invention.

FIG. 27 is a sectional view showing a power semiconductor device according to a fourteenth embodiment of the present invention. As shown in FIG. 27, on one side of an n-base layer 31 having a high resistivity, a p-collector layer 33 having a high impurity concentration is disposed. An n-buffer layer having a high impurity concentration may be disposed between the n-base layer 31 and p-collector layer 33. On the other side of the n-base layer 31, a plurality of trenches 34 are formed at intervals in the n-base layer 31, such that main cells MR and dummy cells DR are partitioned.

In each of the main cells MR, an n-barrier layer 32 having an impurity concentration higher than that of the n-base layer 31 is formed in the surface of the n-base layer 31. A p-base layer 37 is disposed on the n-barrier layer 32. N-emitter layers 38 are formed in the surface of the p-base layer 37. In each of the dummy cells DR, a p-diverter layer 39 is disposed on the n-base layer 31. The p-base layers 37 and p-diverter layers 39 may be formed independently of each other, or may be formed by dividing a common p-layer by the trenches 34.

A collector electrode 41 is disposed on and in contact with the p-collector layer 33. An emitter electrode 42 is disposed on and in contact with the p-base layer 37 and n-emitter layers 38. A p-contact layer having a high impurity concentration may be formed in the p-base layer 37 and in contact with the emitter electrode 42.

Of the trenches 34, the trench 34 adjacent to each of the main cells MR is provided with a gate electrode 36 buried therein, while it is wrapped in a gate insulating film 35. Where the main cells MR and dummy cells DR are alternately disposed, the gate electrode 36 is buried in each of all the trenches 34. The gate electrode 36 faces that portion of the p-base layer 37, which is sandwiched between the n-base layer 31 and n-emitter layer 38, through the gate insulating film 35.

As a consequence, an n-channel MOSFET is formed in the main cell MR, such that it selectively connects the n-emitter layer 38 to the n-base layer 31, using the p-base layer 37 as a channel region, to inject electrons. On the other hand, the dummy cells DR are not provided with such an n-channel MOSFET.

The power semiconductor device shown in FIG. 27 can attain a low on-state voltage almost the same as that of a thyristor, where the impurity concentration in the n-barrier layer 32, and/or the depth, width, interval of the trenches 34 are suitably designed. This is given by a barrier effect of the n-barrier layer 32 and a narrow current passage formed by each of the main cells MR, which restrict holes being exhausted into the emitter electrode 42. As a consequence, the injection efficiency of electrons from the n-emitter layers 38 into the n-base layer 31 improves.

A diverter electrode 43 is disposed on the p-diverter layer 39 in each of the dummy cells DR. The diverter electrode 43 is electrically connected to the emitter electrode 42 through a rectifying element 44. The cathode side and anode side of the rectifying element 44 are electrically connected to the emitter electrode 42 and diverter electrode 43, respectively.

Figure 28A:
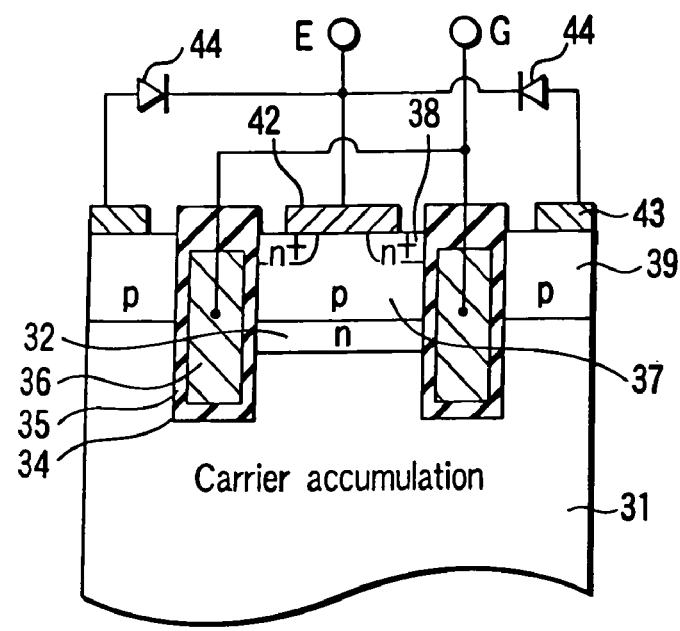
FIGS. 28A and 28B are views showing operations of the power semiconductor device shown in FIG. 27.
Figure 28B:
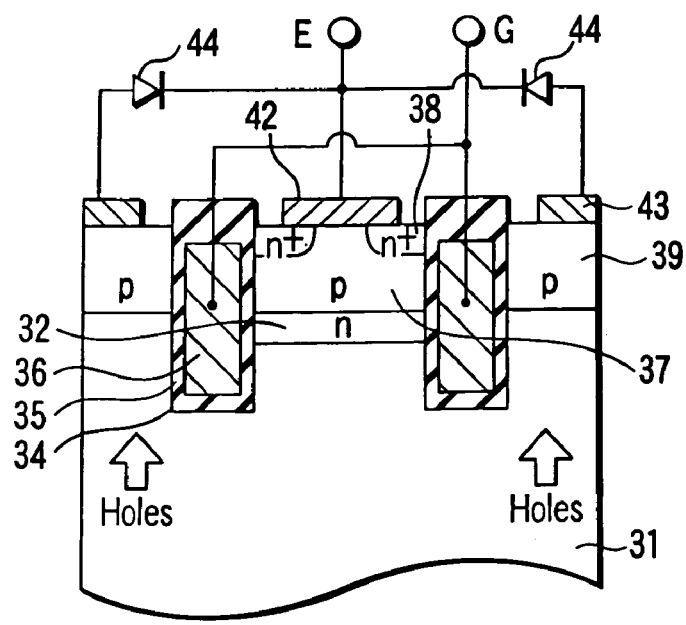

FIGS. 28A and 28B are views showing operations of the power semiconductor device shown in FIG. 27. The rectifying element 44 is preset to be conductive when the p-diverter layer 39 is supplied with a potential larger than the built-in voltage (about 0.7V). When the rectifying element 44 is conductive in the process of turn-off of the device, holes are exhausted to the emitter electrode 42 through the rectifying element 44.

As shown in FIG. 28A, in the on-state, the resistance against holes being exhausted to the p-base layer 37 is high due to the n-barrier layer 32. At this time, since the potential of the p-diverter layer 39 is low, the rectifying element 44 does not become conductive, thereby prevent holes from being exhausted. As a consequence, the dummy cell with the p-diverter layer 39 provides the same effect as the dummy cell of an IEGT does. This effect cooperates with the barrier effect of the n-barrier layer to greatly reduce the on-resistance of the device.

On the other hand, as shown in FIG. 28B, in the process of turn-off, the potential of the p-diverter layer 39 increases and the rectifying element 44 becomes conductive. Then, holes are exhausted from the n-base layer 31 through the p-diverter layer 39 into the emitter electrode 42. At this time, due to a high resistance of the n-barrier layer 32 against holes, the quantity of holes flowing through the main cell including the n-emitter layers 38 is smaller than that through the dummy cell including the p-diverter layer 39. As a consequence, in the turn-off, holes are mainly exhausted from the p-diverter layer 39, thereby shortening the turn-off time and reducing the turn-off loss.

As a secondary effect of the n-barrier layer 32, the hole current flowing directly below the n-emitter layers 38 reduces, as compared to any of IEGT, CSTBT, and diverter structures. This increases the latch-up withstand capacity of the power semiconductor device, and improves the shut-off withstand capacity and load-shortcircuit withstand capacity thereof.

(Fifteenth Embodiment)

Figure 29:
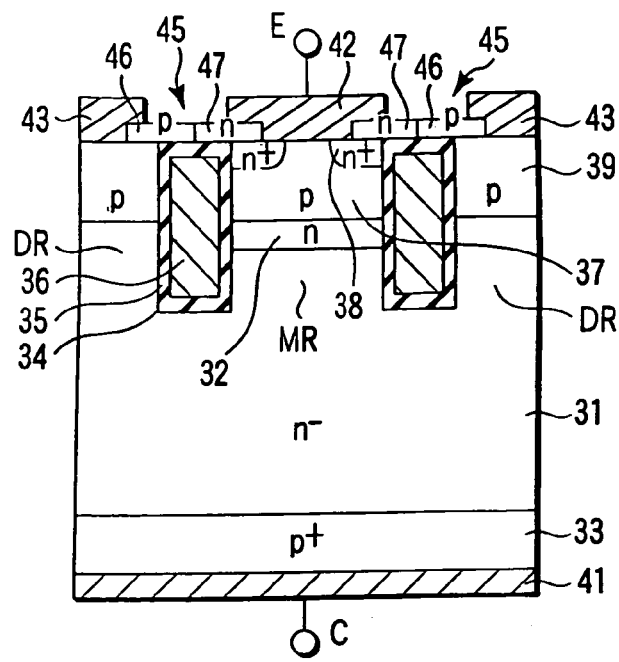
FIG. 29 is a sectional view showing a power semiconductor device according to a fifteenth embodiment of the present invention.

FIG. 29 is a sectional view showing a power semiconductor device according to a fifteenth embodiment of the present invention. This embodiment adopts a diode 45 as an example of the rectifying element 44 shown in FIG. 27.

Specifically, a semiconductor layer having a p-anode layer 46 and n-cathode layer 47 is disposed on an n-emitter layer 38, insulating film 35 in a trench 34, and p-diverter layer 39. The p-anode layer 46 is in contact with a diverter electrode 43, while the n-cathode layer 47 is in contact with an emitter electrode 42. This device may be formed by the following method.

First, poly-crystalline silicon doped with an n- (or p-) type impurity is deposited on the surface of a substrate by means of, e.g., CVD. At a portion to have an opposite conductivity type, a p- (or n-) type impurity is ion-implanted, and thermally diffused. Then, the diverter electrode 43 and emitter electrode 42 are formed to be in contact with the p-anode layer 46 and n-cathode layer 47, respectively.

(Sixteenth Embodiment)

Figure 30:
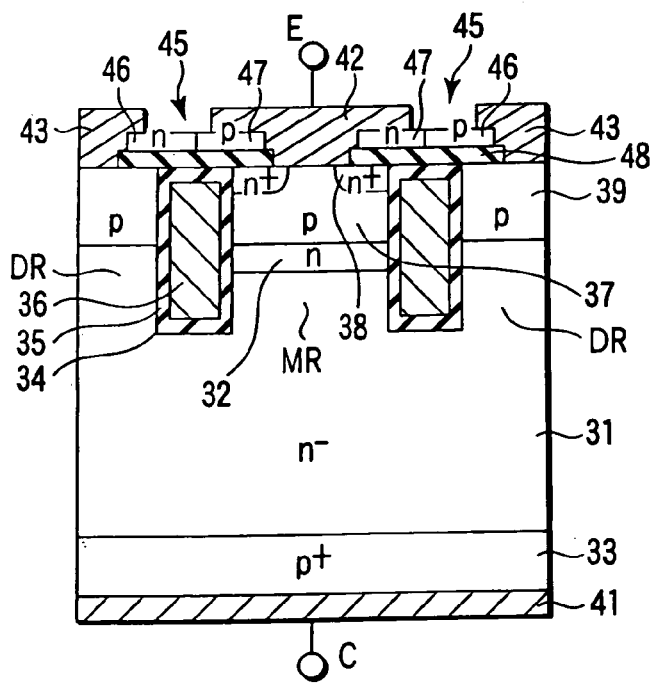
FIG. 30 is a sectional view showing a power semiconductor device according to a sixteenth embodiment of the present invention.

FIG. 30 is a sectional view showing a power semiconductor device according to a sixteenth embodiment of the present invention. This embodiment adopts a diode 45, which is disposed on the surface of a substrate through an insulating film, and functions as the rectifying element 44 shown in FIG. 27.

Specifically, an insulating film 48 is disposed on an n-emitter layer 38, insulating film 35 in a trench 34, and p-diverter layer 39. A semiconductor layer having a p-anode layer 46 and n-cathode layer 47 is disposed on the insulating film 48. The p-anode layer 46 is in contact with a diverter electrode 43, while the n-cathode layer 47 is in contact with an emitter electrode 42. This device has an increased insulation property above the gate electrode 36, thereby improving the reliability of the device.

(Seventeenth Embodiment)

Figure 31:
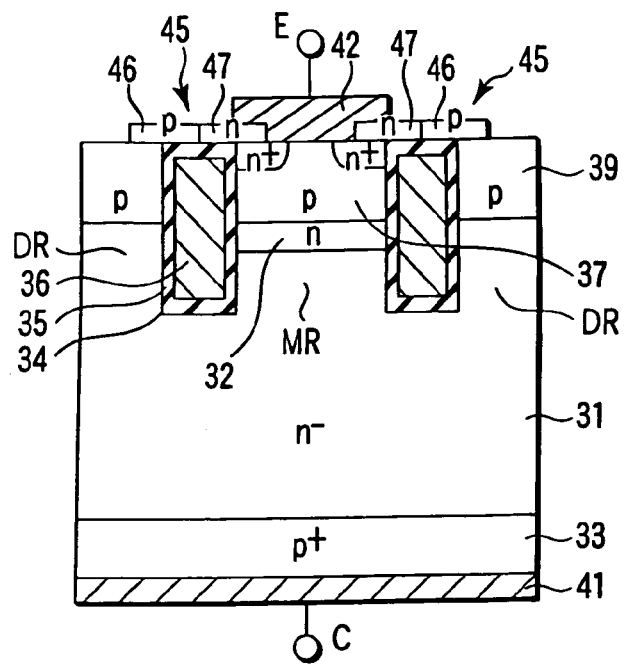
FIG. 31 is a sectional view showing a power semiconductor device according to a seventeenth embodiment of the present invention.

FIG. 31 is a sectional view showing a power semiconductor device according to a seventeenth embodiment of the present invention. This embodiment adopts a diode 45, which is disposed directly on the surface of a substrate, and functions as the rectifying element 44 shown in FIG. 27.

Specifically, a semiconductor layer having a p-anode layer 46 and n-cathode layer 47 is disposed on an n-emitter layer 38, insulating film 35 in a trench 34, and p-diverter layer 39. Since no diverter electrode 43 is disposed, the p-anode layer 46 is in contact with the p-diverter layer 39, while the n-cathode layer 47 is in contact with an emitter electrode 42. This device can simplify the wiring structure on the emitter side.

(Eighteenth Embodiment)

Figure 32:
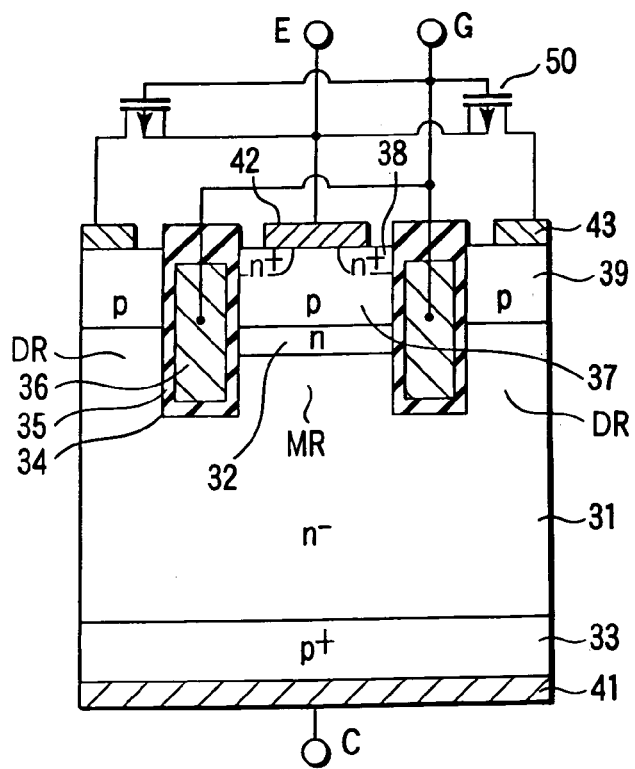
FIG. 32 is a sectional view showing a power semiconductor device according to an eighteenth embodiment of the present invention.

FIG. 32 is a sectional view showing a power semiconductor device according to an eighteenth embodiment of the present invention. This embodiment adopts a p-channel MOSFET 50 for selectively connecting a diverter electrode 43 to an emitter electrode 42. The p-channel MOSFET 50 is driven by a driving electrode electrically connected to a gate electrode 36.

In the power semiconductor device shown in FIG. 32, when the applied voltage between the gate and emitter lowers from positive to negative (a change in potential of the gate electrode 36) and takes a predetermined negative value, the p-channel MOSFET 50 becomes conductive. Then, holes are exhausted from the n-base layer 31 through the p-diverter layer 39 into the emitter electrode 42.

Since the driving electrode of the p-channel MOSFET 50 is ganged with the gate electrode 36 of the main structure, holes can be prevented from being exhausted when the potential of the p-diverter layer 39 increases in the on-state, unlike the device shown in FIG. 27. Furthermore, the MOSFET has no built-in voltage, thereby reducing the resistance against holes being exhausted in the turn-off.

(Nineteenth Embodiment)

Figure 33:
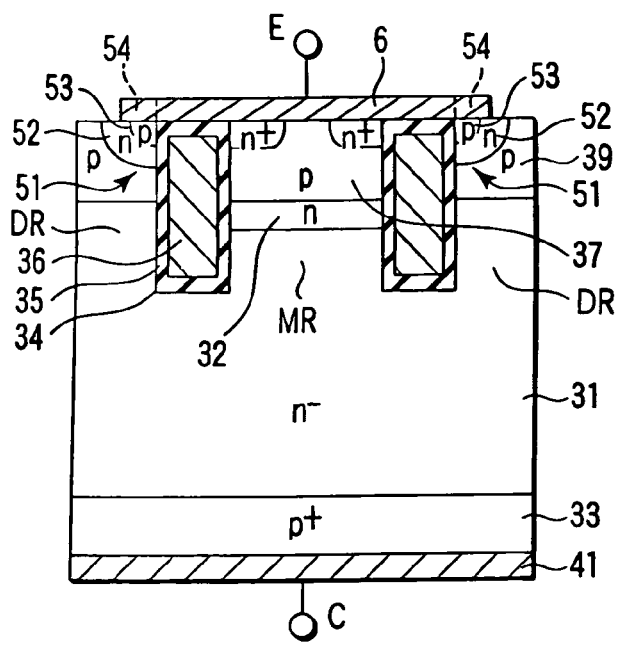
FIG. 33 is a sectional view showing a power semiconductor device according to a nineteenth embodiment of the present invention.

FIG. 33 is a sectional view showing a power semiconductor device according to a nineteenth embodiment of the present invention. This embodiment adopts a MOSFET 51, which is formed in the bulk of a substrate, and functions as the p-channel MOSFET 50 shown in FIG. 32.

Specifically, an n-intermediate layer 52 is formed in a p-diverter layer 39 and in contact with a trench 34. In addition, a p-counter layer 53 is formed in the surface of the n-intermediate layer 52. The n-intermediate layer 52 and p-counter layer 53 are in contact with an additional electrode 54, which is formed of an integrally extending portion of an emitter electrode 42. The p-channel MOSFET 51 uses the n-intermediate layer 52 as a channel region, parts of the p-counter layer 53 and p-diverter layer 39 as a pair of source/drain regions, and that portion of a gate electrode 36, which faces the intermediate layer 52 through a gate insulating film 35, as a driving electrode. This device can simplify the wiring structure on the emitter side.

(Twentieth Embodiment)

Figure 34:
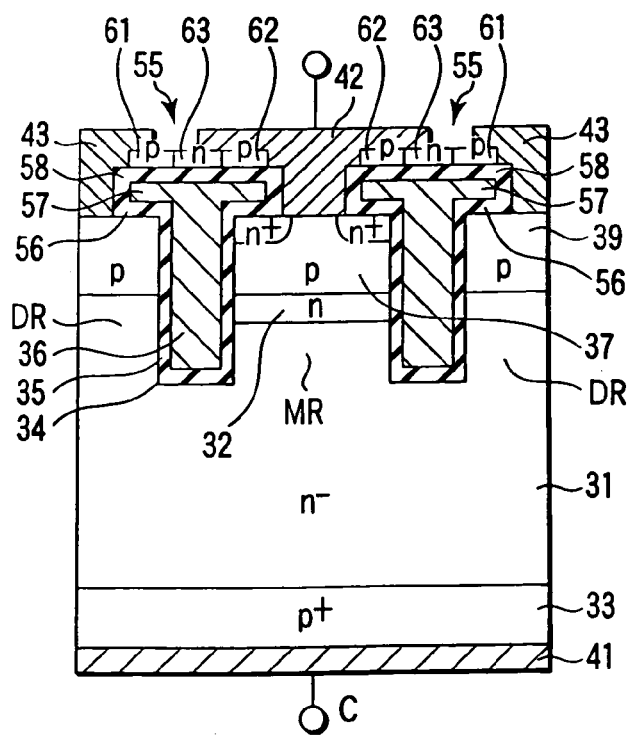
FIG. 34 is a sectional view showing a power semiconductor device according to a twentieth embodiment of the present invention.

FIG. 34 is a sectional view showing a power semiconductor device according to a twentieth embodiment of the present invention. This embodiment adopts a MOSFET 55, which is formed on the surface of a substrate, and functions as the p-channel MOSFET 50 shown in FIG. 32.

Specifically, the p-channel MOSFET 55 has a driving electrode 56 disposed on an n-emitter layer 38, trench 34, and p-diverter layer 39, through an insulating film 57. The driving electrode 56 is formed integrally with a gate electrode 36 such that the gate electrode 36 and driving electrode 56 form a T-shape in a sectional view. A semiconductor layer is disposed on the driving electrode 56 through an insulating film 58, and providing a pair of p-source/drain layers 61 and 62, and an n-base layer 63 for the channel region, of the p-channel MOSFET 55. The pair of the p-source/drain layers 61 and 62 are in contact with a diverter electrode 43 and emitter electrode 42, respectively.

The device shown in FIG. 34 facilitates design of the threshold voltage of the p-channel MOSFET, as compared to the device shown in FIG. 32, which requires a triple diffusion process. On the other hand, this device entails a complicated wiring structure, as compared to the device shown in FIG. 32.

(Twenty-first Embodiment)

Figure 35A:
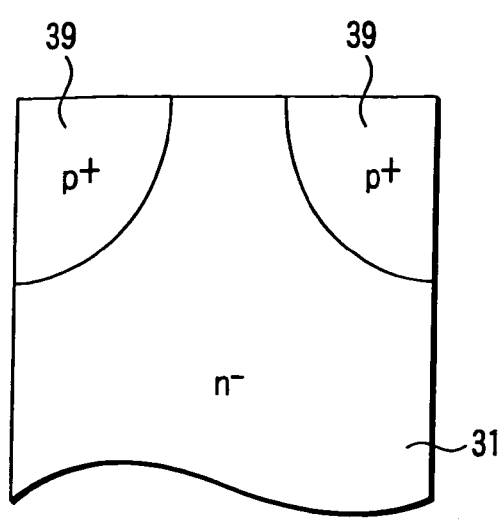
FIGS. 35A to 35C are sectional views showing steps of a method of manufacturing a power semiconductor device according to a twenty-first embodiment of the present invention.
Figure 35B:
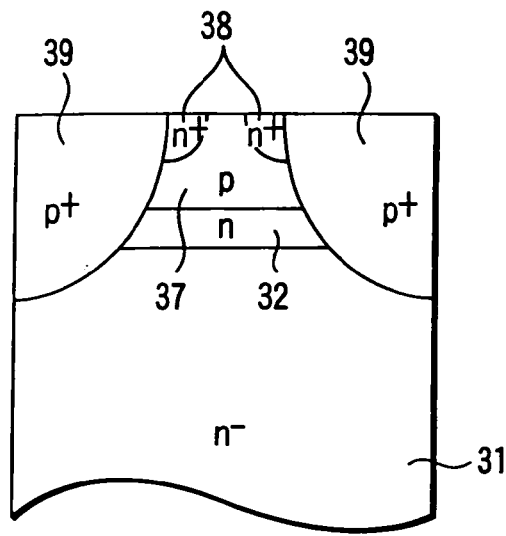
Figure 35C:
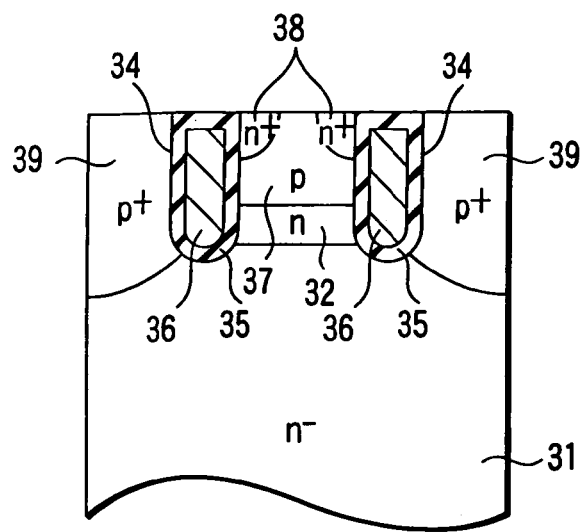

FIGS. 35A to 35C are sectional views showing steps of a method of manufacturing a power semiconductor device according to a twenty-first embodiment of the present invention. This manufacturing method can be applied to any of the devices shown in FIGS. 27 to 34 (the fourteenth to twentieth embodiments).

First, a plurality of p-diverter layers 39 are formed in the surface of a n-base layer 31 by means of diffusion, not to overlap with regions corresponding to n-emitter layers 38 (FIG. 35A). In this embodiment, the p-diverter layers 39 are formed to have a depth larger than that of trenches 34. In this respect, the p-diverter layers 39 may be formed as shallow layers as shown in FIG. 27.

Then, impurities are ion-implanted into portions corresponding to n-barrier layers 32, p-base layers 37, and n-emitter layers 38 between the plurality of p-diverter layers 39. Then, a thermal treatment is performed, so that the ion-implanted impurities are diffused and activated, thereby forming the n-barrier layers 32, p-base layers 37, and n-emitter layers 38 (FIG. 35B). Then, a plurality of trenches 34 are formed to partition the p-diverter layers 39 from the p-base layers 37. Then, gate insulating films 35 and gate electrodes 36 are sequentially formed in the trenches 34 (FIG. 35C).

According to this method, the p-base layers 37 and p-diverter layers 39 are separately formed, and then partitioned by the trench 34 at the end. In this case, the impurity concentration in the p-base layers 37 can be independently controlled, thereby increasing the reliability of the MOS channel region.

(Twenty-second Embodiment)

FIGS. 36A to 36D are sectional views showing steps of a method of manufacturing a power semiconductor device according to a twenty-second embodiment of the present invention. This manufacturing method can be applied to any of the devices shown in FIGS. 27 to 34 (the fourteenth to twentieth embodiments).

Figure 36A:
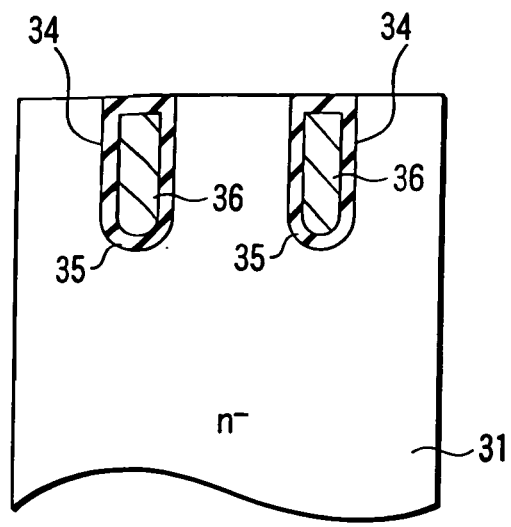
FIGS. 36A to 36D are sectional views showing steps of a method of manufacturing a power semiconductor device according to a twenty-second embodiment of the present invention.
Figure 36B:
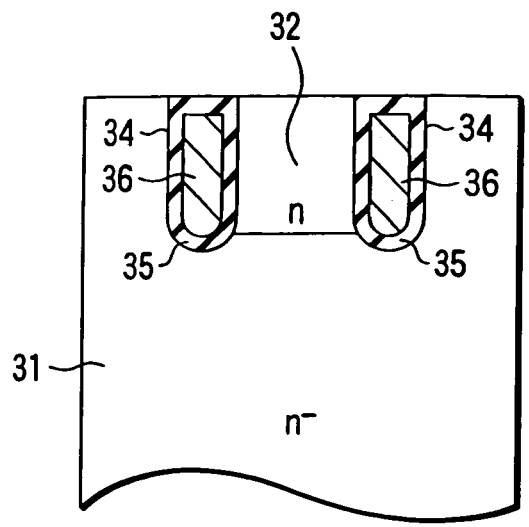

First, a plurality of trenches 34 are formed at intervals in an n-base layer 31. Then, gate insulating films 35 and gate electrodes 36 are sequentially formed in the trenches 34 (FIG. 36A). Then, n-barrier layers 32 are formed in the surface of an n-base layer 31 by means of diffusion, at regions between the plurality of trenches 34, e.g., at every other region (FIG. 36B).

Figure 36C:
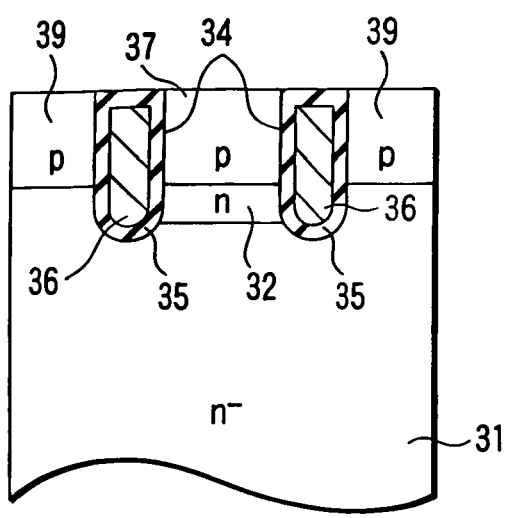
Figure 36D:
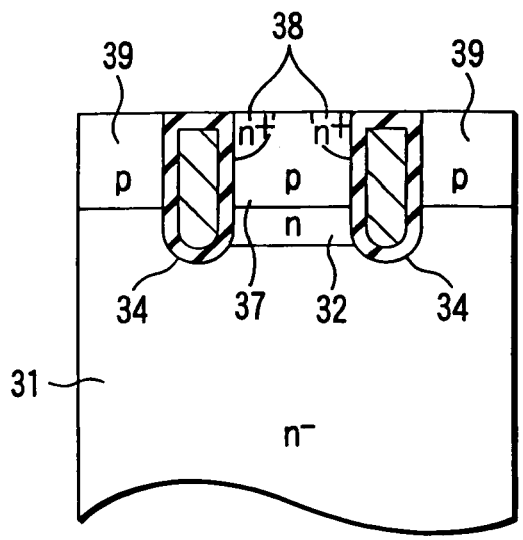

Then, a p-impurity is diffused in the surface of the n-base layer 31 and n-barrier layers 32 at all the regions between the plurality of trenches 34. By doing so, p-base layers 37 and p-diverter layers 39 are formed at the same time (FIG. 36C). Then, n-emitter layers 38 are formed in the surface of the p-base layers 37 (FIG. 36D).

According to this method, the p-base layers 37 and p-diverter layers 39 are formed in self-alignment relative to the trenches 34. In this case, there is no fear of mask-misalignment for the p-diverter layers 39.

(Twenty-third Embodiment)

Figure 37:
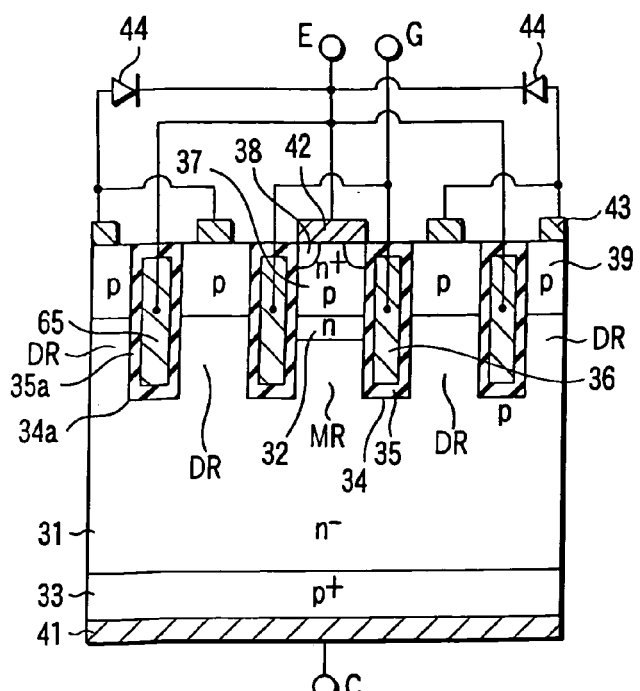
FIG. 37 is a sectional view showing a power semiconductor device according to a twenty-third embodiment of the present invention.

FIG. 37 is a sectional view showing a power semiconductor device according to a twenty-third embodiment of the present invention. The device according to this embodiment has a rectifying element 44 for electrically connecting a p-diverter layer 39 to an emitter electrode 42, as in the device shown in FIG. 27. In this embodiment, however, the area of p-diverter layers 39 is formed wider.

Specifically, main cells MR and dummy cells DR are not alternately disposed, but a plurality of dummy cells DR are disposed in series next to one main cell MR. In other words, dummy trenches 34a are formed to partition a plurality of dummy cells DR in wider p-diverter layers 39 disposed one on either side of one main cell MR. The dummy trenches 34a and main trenches 34 are disposed at substantially constant intervals, while having substantially the same dimensions. Each of the dummy trenches 43a is provided with a dummy electrode 65 buried therein, while it is wrapped in an insulating film 35ab. The dummy electrode 65 is electrically connected to the emitter electrode 42.

With an increase in the width of the p-diverter layer 39, such an effect is enhanced that improves injection efficiency of electrons with a narrow current passage formed in an IEGT structure. On the other hand, if the intervals of the trenches 34 are too large, electric field concentration is caused at the bottom of each trench 34, thereby lowering the breakdown voltage. The dummy trenches 34a are formed as a countermeasure against this problem. In this case, if the dummy electrode 65 is electrically connected to a gate electrode 36, the gate capacity is increased, thereby reducing the switching speed. For this reason, the dummy electrode 65 is electrically connected to the emitter electrode 42. Accordingly, this device can reduce the on-resistance while preventing the switching speed from being reduced due to an increase in the gate capacity.

(Twenty-fourth Embodiment)

Figure 38:
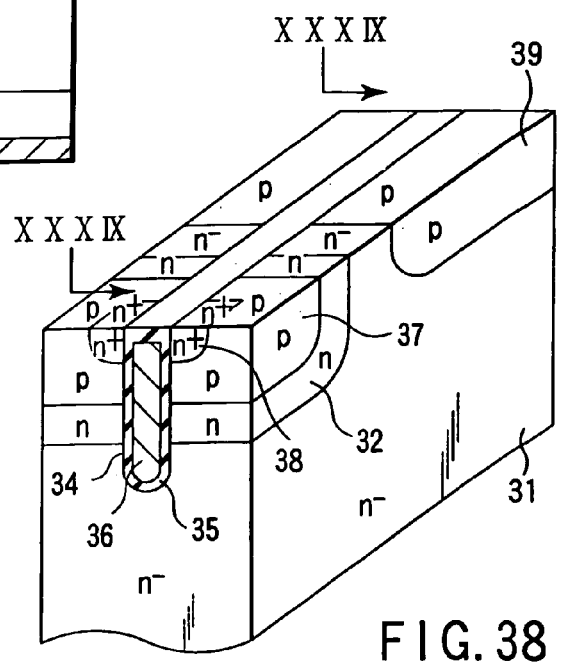
FIG. 38 is a sectional perspective view showing a power semiconductor device according to a twenty-fourth embodiment of the present invention.
Figure 39:
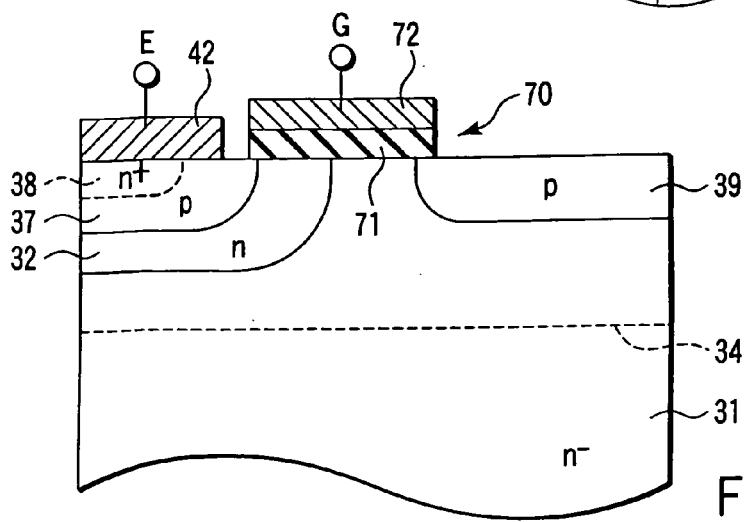
FIG. 39 is a sectional view taken along line XXXIX—XXXIX in FIG. 38.

FIG. 38 is a sectional perspective view showing a power semiconductor device according to a twenty-fourth embodiment of the present invention. FIG. 39 is a sectional view taken along line XXXIX—XXXIX in FIG. 38. This embodiment adopts a p-channel MOSFET 70 for selectively connecting a p-diverter layer 39 to an emitter electrode 42, as in the device shown in FIG. 32. In this embodiment, however, a p-base layer 37 and p-diverter layer 39 are lined up along a trench 34 on the same side of the trench 34 in the channel width direction.

Specifically, an n-barrier layer 32 having an impurity concentration higher than that of an n-base layer 31 is formed in the surface of the n-base layer 31. The p-base layer 37 is formed in the surface of the n-barrier layer 32. An n-emitter layer 38 is formed in the surface of the p-base layer 37. The p-diverter layer 39 is formed in the surface of the n-base layer 31 at a position separate from the n-barrier layer 32. The trench 34 is formed to divide each of the n-emitter layer 38, p-base layer 37, n-barrier layer 32, and p-base layer 37 into two portions.

A gate electrode 72 is disposed, through the gate insulating film 71, on those surface portions of the n-base layer 31 and n-barrier layer 32, which are sandwiched between the p-base layer 37 and p-diverter layer 39. As a consequence, the p-channel MOSFET 70 is formed, such that it selectively connects the p-diverter layer 39 to the p-base layer 37, using the n-base layer 31 and n-barrier layer 32 as a channel region, to exhaust holes. The gate electrode 72 used as the driving electrode of the p-channel MOSFET 70 is electrically connected to a gate electrode 36 disposed in the trench 34. As a consequence, in the turn-off, holes are exhausted by the p-channel MOSFET 70 from the p-diverter layer 39 through the p-base layer 37 into the emitter electrode 42.

This device structure can be manufactured by a method simpler than the methods according to the twenty-first and twenty-second embodiments. FIGS. 40A to 40D are sectional views showing steps of a method of manufacturing the power semiconductor device according to the twenty-fourth embodiment of the present invention.

Figure 40A:
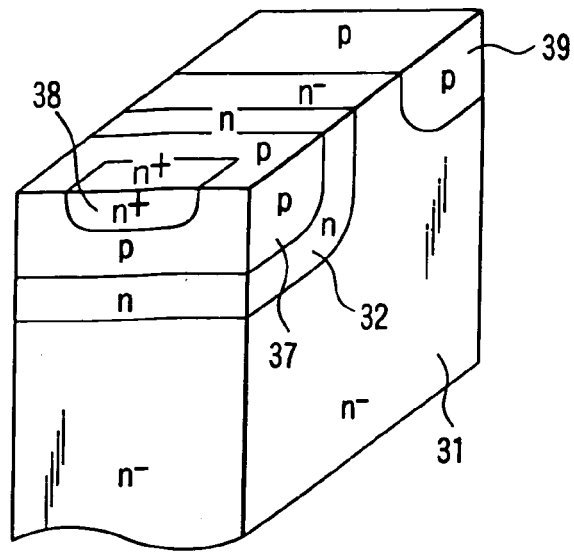
FIGS. 40A to 40D are sectional views showing steps of a method of manufacturing the power semiconductor device according to the twenty-fourth embodiment of the present invention.
Figure 40B:
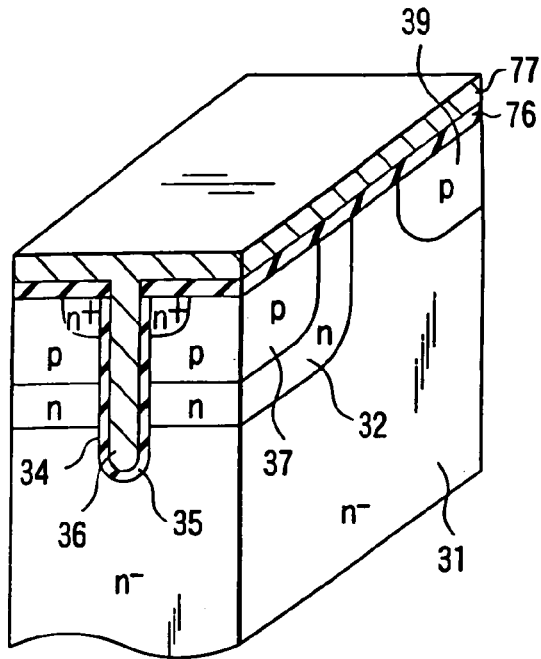
Figure 40C:
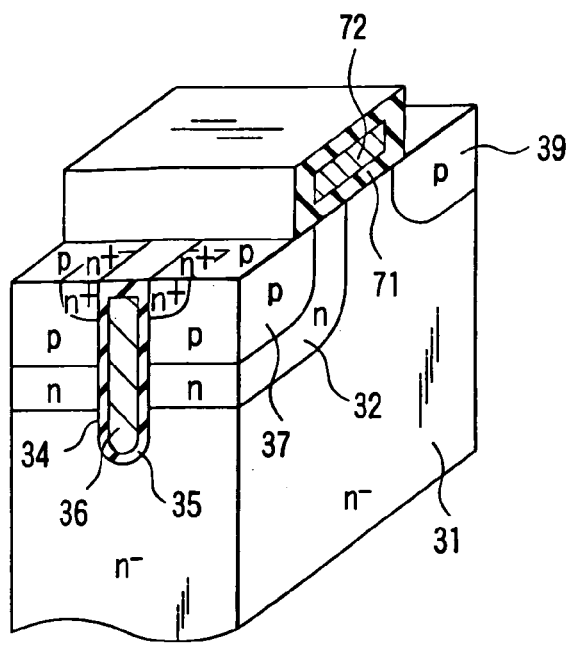

First, the n-barrier layer 32, p-base layer 37, n-emitter layer 38, and p-diverter layer 39 are formed in the surface of the n-base layer 31 by means of diffusion (FIG. 40A). Then, the trench 34 is formed from the surface of the substrate into the n-base layer 31 to divide the layers 32, 37, 38, and 39 into two portions. Then, an insulating film 76 and conductive film 77 are sequentially formed over the inside of the trench 34 and the surfaces of the layers 32, 37, 38, and 39 (FIG. 40B).

Figure 40D:
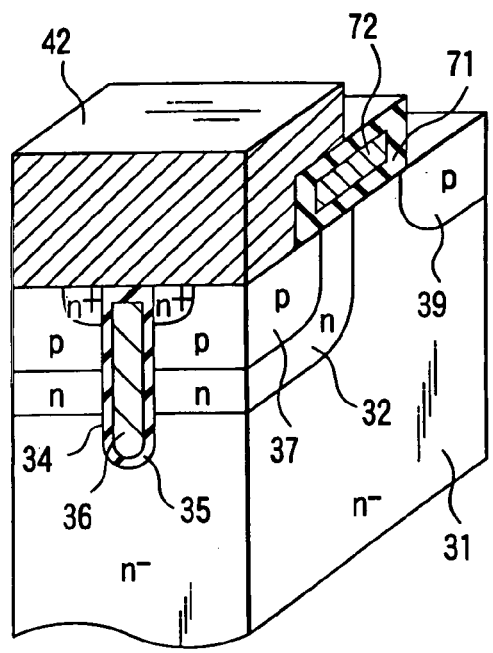

Then, the insulating film 76 and conductive film 77 are partly removed to leave their portions in the trench 34 and on the surfaces of the n-base layer 31 and n-barrier layer 32. As a consequence, the gate insulating film 35 and gate electrode 36 in the trench 34, and the gate insulating film 71 and gate electrode 72 of the p-channel MOSFET 70 are formed (FIG. 40C) Then, an insulating oxide film is formed to cover the gate electrode 72, and the emitter electrode 42 is formed thereafter (FIG. 40D).

According to this method, a device having a function equivalent to that of the device shown in FIG. 32 can be realized by a manufacturing method with a lower difficulty. In addition, the impurity concentration in the p-base layers 37 can be controlled independently of the p-diverter layer 39, thereby increasing the reliability of the MOS channel region.

(Twenty-fifth Embodiment)

Figure 41A:
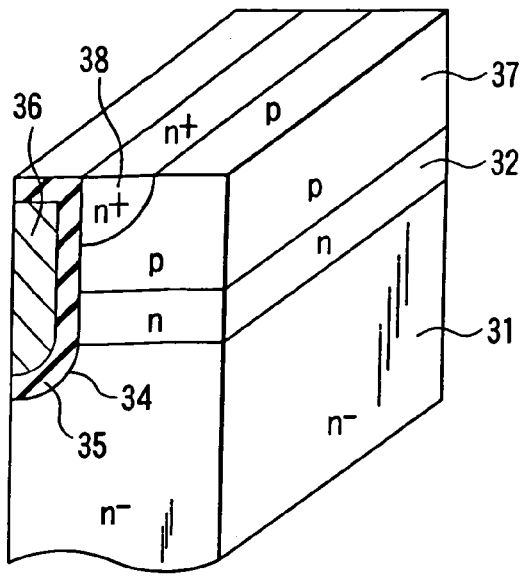
FIGS. 41A and 41B are sectional perspective views showing power semiconductor devices according to a twenty-fifth embodiment of the present invention, and a modification thereof, respectively.
Figure 41B:
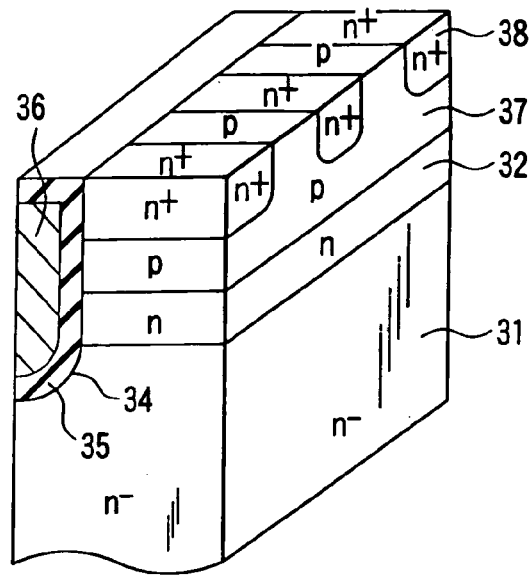

FIGS. 41A and 41B are sectional perspective views showing power semiconductor devices according to a twenty-fifth embodiment of the present invention, and a modification thereof, respectively. This embodiment relates to the structure of an n-emitter layer 38. The structure of an n-emitter layer 38 shown in FIGS. 41A and 41B can be applied to any of the devices shown in FIGS. 27 to 37 (the fourteenth to twenty-third embodiments).

In FIG. 41A, an n-emitter layer 38 is formed of a band-like layer extending along a trench 34 in the surface of a p-base layer 37. In this case, the n-emitter layer 38 and p-base layer 37 are in contact with an emitter electrode 42 by their surface portions extending in parallel with the trench 34.

In FIG. 41B, an n-emitter layer 38 is formed of a plurality of layer portions separated along a trench 34 in the surface of a p-base layer 37. In this case, the n-emitter layer 38 and p-base layer 37 are alternately in contact with an emitter electrode 42 along the trench 34.

According to the structure shown in FIG. 41B, where the structure is miniaturized to improve the performance of the device, contact of the n-emitter layer 38 with the emitter electrode 42 can be obtained even without mask alignment. In addition, this structure allows the intervals of trenches 34 to be smaller, thereby further increasing the resistance against holes being exhausted to reduce the on-resistance.

(Twenty-sixth Embodiment)

Figure 42:
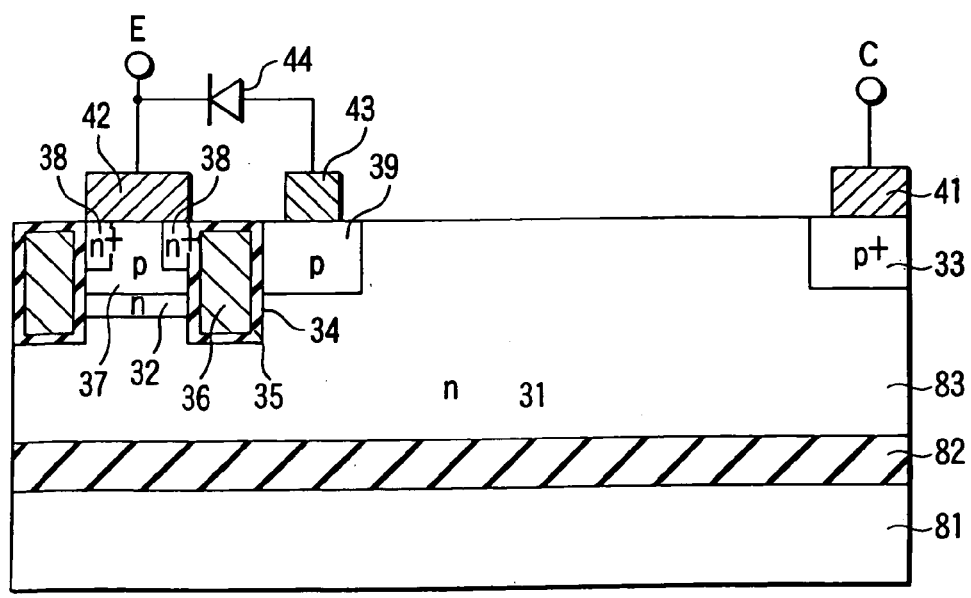
FIG. 42 is a sectional view showing a power semiconductor device according to a twenty-sixth embodiment of the present invention.

FIG. 42 is a sectional view showing a power semiconductor device according to a twenty-sixth embodiment of the present invention. This embodiment relates to an example of power semiconductor devices of the lateral type, which has a function equivalent to that of the device shown in FIG. 27

As shown in FIG. 42, this device is formed on an SOI (Silicon On Insulator) substrate, which has a semiconductor support layer 81, insulating layer 82, and semiconductor active layer 83. The active layer 83 is used as an n-base layer 31 having a high resistivity. A p-collector layer 33 and collector electrode 41 are disposed on the right side in FIG. 42. Trenches 34 are formed in the n-base layer 31 at a position remote from the p-collector layer 33, on the left side in FIG. 42. The structure around the trenches 34 is the same as that of the upper portion of the device shown in FIG. 27.

Since the device shown in FIG. 27 has a structure of the vertical type, in which the collector electrode and emitter electrode are disposed to sandwich the substrate, the main current flows vertically in the n-base layer 31. On the other hand, since the device shown in FIG. 42 has a structure of the lateral type, in which the collector electrode and emitter electrode are disposed on the same side of the substrate, the main current flows horizontally in the n-base layer 31. Except for this difference, these two devices operate the same in principle. Accordingly, although the first to twenty-fifth embodiments are exemplified by power semiconductor devices of the vertical type, the features of these embodiments may be applied, as they are, to power semiconductor devices of the lateral type, as shown in FIG. 42.

According to the first to twenty-sixth embodiments of the present invention, it is possible to provide a power semiconductor device, which has a better switching characteristic while maintaining a low on-state voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device comprising:
   a first base layer of a first conductivity type;
   a collector layer of a second conductivity type disposed on the first base layer;
   a plurality of trenches disposed in the first base layer at intervals to partition a main cell and a dummy cell, at a position remote from the collector layer;
   a second base layer of the second conductivity type disposed on the first base layer in the main cell;
   an emitter layer of the first conductivity type disposed on the second base layer;
   a buffer layer of the second conductivity type disposed on the first base layer in the dummy cell;
   a gate electrode disposed in a trench of the plurality of trenches, adjacent to the main cell, to face, through a gate insulating film, a portion of the second base layer sandwiched between the first base layer and the emitter layer;
   a collector electrode disposed on the collector layer;
   an emitter electrode disposed on the second base layer and the emitter layer; and
   a buffer resistor inserted between the buffer layer and the emitter electrode,
   wherein the main cell forms a current passage narrow enough to provide, in an on-state of the device, an increase in resistance against flow of carriers of the second conductivity type from the first base layer into the emitter electrode through the second base layer, thereby improving injection efficiency of carriers of the first conductivity type from the emitter layer into the first base layer, and
   the buffer resistor has a resistance value smaller than that with which gate-emitter voltage is increased by gate negative capacity, in a period of time for an applied voltage between gate and emitter to charge capacity between gate and collector, in process of turn-on of the device.

2. The device according to claim 1, wherein the buffer resistor employs a resistance of an interconnection line including a resistor disposed outside the buffer layer.

3. The device according to claim 2, further comprising a buffer electrode disposed on the buffer layer, wherein the interconnection line electrically connects the buffer electrode to the emitter electrode.

4. The device according to claim 1, wherein the buffer resistor employs a lateral resistance of the buffer layer.

5. The device according to claim 4, wherein a buffer electrode electrically connected to the emitter electrode is disposed on the buffer layer, at a position beyond an end of the emitter layer in a channel width direction.

6. The device according to claim 4, wherein the buffer layer is electrically connected to the second base layer through a connection layer comprising a semiconductor layer of the second conductivity type, at a position beyond an end of the gate electrode in a channel width direction.

7. The device according to claim 6, wherein the connection layer comprises a layer formed integrally with the second base layer and the buffer layer.

8. The device according to claim 6, wherein the connection layer comprises a layer having an impurity concentration higher than that of the buffer layer.

9. The device according to claim 6, wherein the connection layer comprises a layer having an impurity concentration lower than that of the buffer layer, and the buffer resistor includes a lateral resistance of the connection layer as a main component.

10. The device according to claim 4, wherein an additional electrode electrically connected to the emitter electrode is disposed at a position beyond an end of the gate electrode in a channel width direction, the buffer layer is electrically connected to the additional electrode through an extension layer comprising a semiconductor layer of the second conductivity type, and the buffer resistor includes a lateral resistance of the extension layer as a main component.

* * * * *